(12) United States Patent
Yamazaki

(10) Patent No.: US 8,816,425 B2
(45) Date of Patent: Aug. 26, 2014

(54) SEMICONDUCTOR DEVICE AND METHOD FOR MANUFACTURING THE SAME

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 191 days.

(21) Appl. No.: 13/297,802

(22) Filed: Nov. 16, 2011

(65) Prior Publication Data

US 2012/0132906 A1 May 31, 2012

(30) Foreign Application Priority Data

Nov. 30, 2010 (JP) ................................. 2010-267919

(51) Int. Cl.
*H01L 29/66* (2006.01)
*H01L 21/84* (2006.01)

(52) U.S. Cl.
USPC .......................................... 257/325; 438/162

(58) Field of Classification Search
USPC ............................... 257/64–67, 325, 335, 43, 257/E21.135–E21.153, E31.034, E31.047; 438/37, 162, 104, 479, 519
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08, 2008, vol. 39, pp. 633-636.

(Continued)

*Primary Examiner* — Calvin Lee
(74) *Attorney, Agent, or Firm* — Eric J. Robinson; Robinson Intellectual Property Law Office, P.C.

(57) ABSTRACT

A transistor in which the state of an interface between an oxide semiconductor layer and an insulating film in contact with the oxide semiconductor layer is favorable and a method for manufacturing the transistor are provided. Nitrogen is added to the vicinity of the interface between the oxide semiconductor layer and the insulating film (gate insulating layer) in contact with the oxide semiconductor layer so that the state of the interface of the oxide semiconductor layer becomes favorable. Specifically, the oxide semiconductor layer has a concentration gradient of nitrogen, and a region containing much nitrogen is provided at the interface with the gate insulating layer. A region having high crystallinity can be formed in the vicinity of the interface with the oxide semiconductor layer by addition of nitrogen, whereby the interface state can be stable.

20 Claims, 14 Drawing Sheets

(56) References Cited

U.S. PATENT DOCUMENTS

| | | | |
|---|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 * | 6/2010 | Akimoto et al. ............... 257/72 |
| 7,923,723 B2 | 4/2011 | Hayashi et al. |
| 8,021,917 B2 | 9/2011 | Akimoto et al. |
| 8,432,187 B2 * | 4/2013 | Kato et al. .................. 326/46 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0065838 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117079 A1 | 5/2010 | Miyairi et al. |
| 2010/0252832 A1 * | 10/2010 | Asano et al. .................... 257/57 |
| 2012/0132903 A1 | 5/2012 | Yamazaki et al. |
| 2012/0132904 A1 | 5/2012 | Yamazaki |
| 2012/0132905 A1 | 5/2012 | Yamazaki |
| 2012/0132907 A1 | 5/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2009-278115 | 11/2009 |
| WO | WO-2004/114391 | 12/2004 |

OTHER PUBLICATIONS

Kim et al., "High-Performance oxide thin film transistors passivated by various gas plasmas," 214th ECS Meeting, 2008, No. 2317.

Park et al., "Improvements in the Device Characteristics of Amorphous Indium Gallium Zinc Oxide Thin-Film Transistors by Ar Plasma Treatment," Applied Physics Letters, 2007, vol. 90, No. 26, pp. 262106-1-262106-3.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Sym-

(56) References Cited

OTHER PUBLICATIONS posium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:AL and Sn-Doped Zinc Indium Oxide Thin Film Transistors for AMOLED Back-Plane,", SID Digest'09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure For Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09: SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu, or Zn]at Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys Rev. A (Physical Review.A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) ,2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide semiconductor upon exposure to water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters) Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

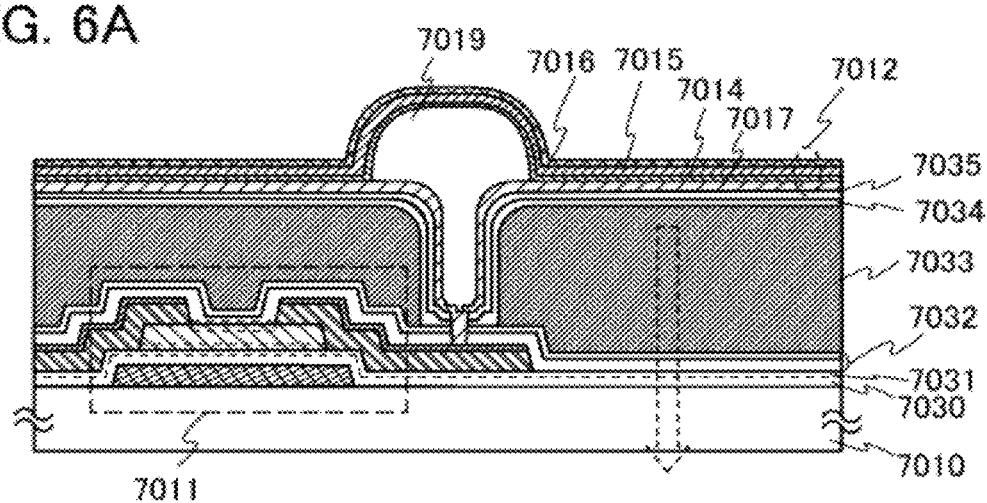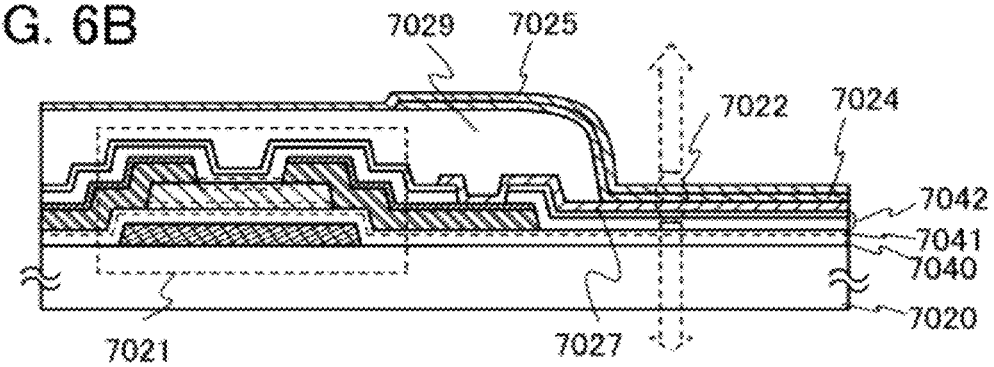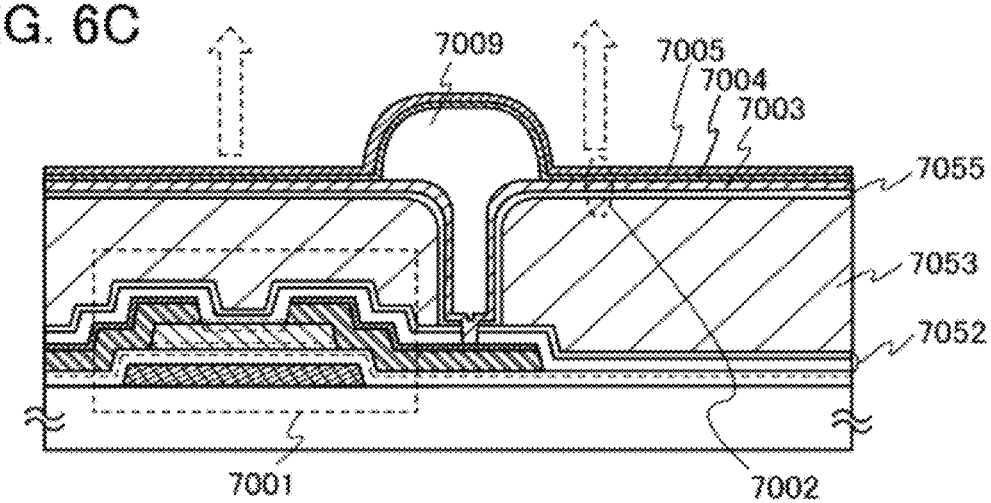

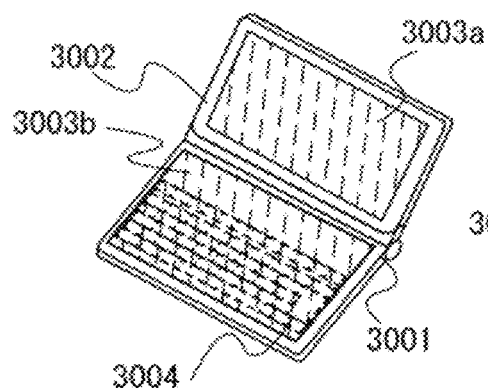
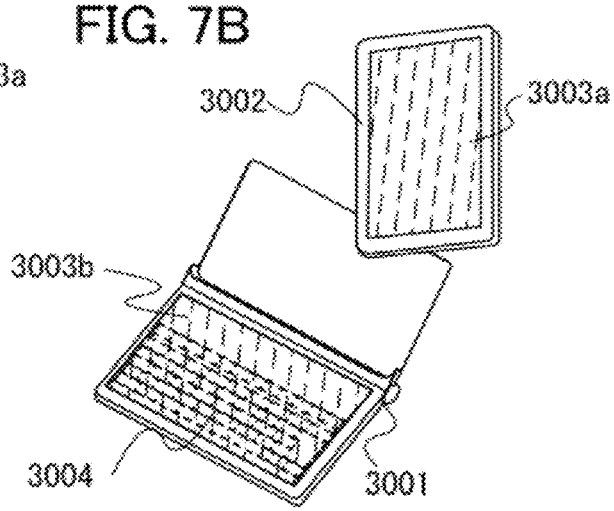
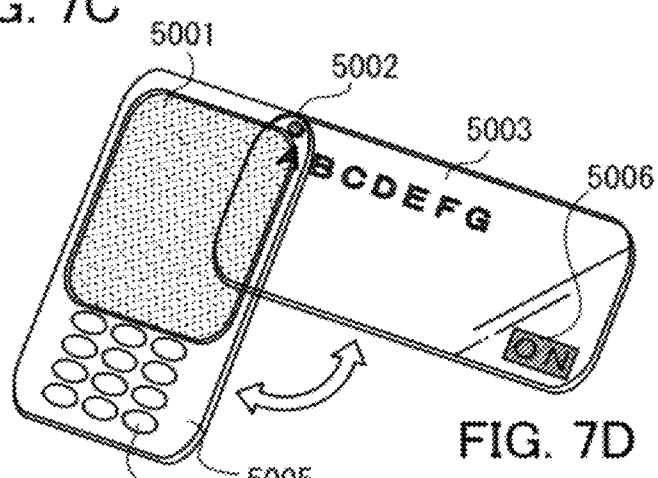
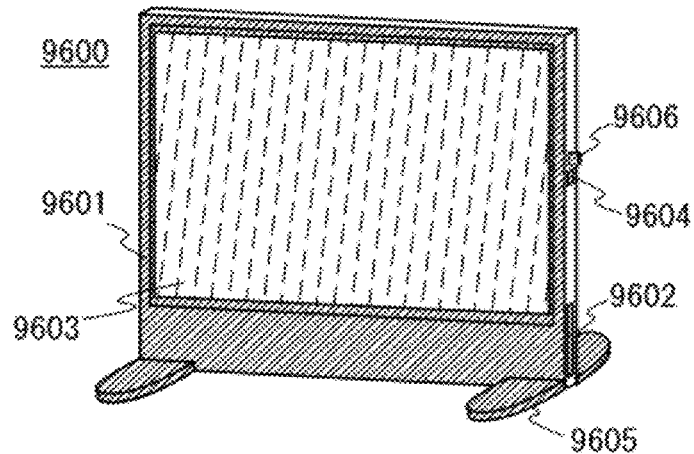

wurtzite crystal structure wurtzite crystal structure layer pattern image layer pattern image layer pattern image layer pattern image

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor and a method for manufacturing the semiconductor device.

In this specification, a semiconductor device generally means a device which can function by utilizing semiconductor characteristics, and an electrooptic device, a semiconductor circuit, and an electronic device are all semiconductor devices.

2. Description of the Related Art

In recent years, techniques to form thin film transistors (TFTs) using a semiconductor thin film (with a thickness of approximately several nanometers to several hundreds of nanometers) which is formed over a substrate having an insulating surface have attracted attention. Thin film transistors are widely applied to electronic devices such as ICs or electro-optical devices, and are particularly expected to be rapidly developed as switching elements of image display devices. Various metal oxides are used for a variety of applications. Indium oxide is a well-known material and is used as a light-transmitting electrode material which is necessary for liquid crystal displays and the like.

Some metal oxides have semiconductor characteristics. Examples of such metal oxides having semiconductor characteristics include tungsten oxide, tin oxide, indium oxide, and zinc oxide. Thin film transistors in each of which a channel formation region is formed using such metal oxide having semiconductor characteristics have already been known (Patent Documents 1 and 2).

REFERENCE

[Patent Document 1] Japanese Published Patent Application No. 2007-123861

[Patent Document 2] Japanese Published Patent Application No. 2007-096055

SUMMARY OF THE INVENTION

Electric characteristics of a transistor are easily affected by the state of an interface between an oxide semiconductor layer and an insulating film in contact with the oxide semiconductor layer. When the interface between an oxide semiconductor layer and an insulating film, that is, the interface of the oxide semiconductor layer, which is on a gate electrode side, is amorphous, electric characteristics of a transistor might be degraded while the transistor is manufactured or after the transistor is manufactured.

Thus, an object of one embodiment of the present invention is to provide a transistor in which the state of an interface between an oxide semiconductor layer and an insulating film in contact with the oxide semiconductor layer, that is, the interface of the oxide semiconductor layer, which is on a gate electrode side, is favorable; and a method for manufacturing the transistor.

Further, another object of one embodiment of the present invention is to provide a transistor with small variation in electric characteristics and a method for manufacturing the transistor.

Nitrogen is added to an insulating film so that the state of an interface between an oxide semiconductor layer and the insulating film in contact with the oxide semiconductor layer becomes favorable. Then, the insulating film to which nitrogen is added and the oxide semiconductor layer are provided in contact with each other, whereby a region having high crystallinity can be formed in the vicinity of the interface between the oxide semiconductor layer and the insulating film in contact with the oxide semiconductor layer. Accordingly, the interface state can be stable.

According to one embodiment of the present invention, a semiconductor device includes a gate electrode layer; a first insulating layer in contact with the gate electrode layer; an oxide semiconductor layer in contact with the first insulating layer; and a second insulating layer in contact with the oxide semiconductor layer. In the semiconductor device, the oxide semiconductor layer has a peak of a nitrogen concentration (highest concentration point) at an interface with the first insulating layer, and the first insulating layer contains nitrogen and has a peak of a nitrogen concentration at an interface with the oxide semiconductor layer.

In the semiconductor device having the above structure, the oxide semiconductor layer has a concentration gradient of nitrogen, which becomes higher as closer to the first insulating layer, and has a concentration gradient of oxygen, which becomes higher as closer to the second insulating layer.

In the semiconductor device having the above structure, a region of the oxide semiconductor layer, which is in the vicinity of the interface with the first insulating layer, has higher crystallinity than other regions. Note that the oxide semiconductor layer is non-single-crystal, and the oxide semiconductor layer is not entirely in an amorphous state but includes at least a c-axis aligned crystal in the oxide semiconductor layer.

In the semiconductor device having the above structure, a nitrogen concentration of the oxide semiconductor layer in the vicinity of the interface with the first insulating layer is higher than or equal to $5 \times 10^{19}/cm^3$ and lower than 7 atomic %. Further, a nitrogen concentration of the oxide semiconductor layer in the vicinity of the interface with the second insulating layer is higher than or equal to $1 \times 10^{17}/cm^3$ and lower than $5 \times 10^{19}/cm^3$. In the oxide semiconductor layer, the energy gap of a region containing much nitrogen is smaller than the energy gap of a region containing less nitrogen; thus, carriers can easily flow in the region. Thus, a structure is employed for a transistor, in which much nitrogen is contained in a region of an oxide semiconductor layer, where carriers flow, and less nitrogen is contained in other regions.

In the semiconductor device having the above structure, the oxide semiconductor layer has a peak of an oxygen concentration at an interface with the second insulating layer, and the second insulating layer contains oxygen and has a peak of an oxygen concentration at an interface with the oxide semiconductor layer.

According to another embodiment of the present invention, in a method for manufacturing a semiconductor device, an oxide semiconductor layer is formed; a source electrode layer and a drain electrode layer are formed over the oxide semiconductor layer; nitrogen is added to part of the oxide semiconductor layer by plasma treatment with a $N_2$ or $N_2O$ gas after heating is performed under a reduced pressure; a gate insulating layer is formed over the oxide semiconductor layer, the source electrode layer, and the drain electrode layer without exposure to air after the plasma treatment; and a gate electrode layer is formed in a position overlapping a region of the oxide semiconductor layer, to which nitrogen is added, through the gate insulating layer.

According to another embodiment of the present invention, in a method for manufacturing a semiconductor device, a gate electrode layer is formed; a gate insulating layer is formed over the gate electrode layer; nitrogen is added to part of the gate insulating layer by plasma treatment with a $N_2$ or $N_2O$ gas; an oxide semiconductor layer is formed in a position overlapping the gate electrode layer through the gate insulating layer; a source electrode layer and a drain electrode layer are formed over the oxide semiconductor layer; oxygen is added to part of the oxide semiconductor layer by oxygen plasma treatment after heating is performed under a reduced pressure; and an insulating layer covering the oxide semiconductor layer, the source electrode layer, and the drain electrode layer is formed under an atmosphere containing oxygen by a sputtering method.

Note that in this specification, a hexagonal crystal structure, which includes trigonal and hexagonal crystal structures classified in seven crystal systems, refers to six crystal families.

In the oxide semiconductor layer, the crystallinity of a region containing nitrogen is high, interface states due to dangling bonds at the interface between the oxide semiconductor layer and the insulating film in contact with the oxide semiconductor layer are reduced, and a favorable condition of the interface can be realized.

When the condition of the interface of the oxide semiconductor layer and the insulating film in contact with the oxide semiconductor layer is made favorable, a transistor with higher electric characteristics can be obtained.

BRIEF DESCRIPTION OF THE DRAWINGS

FIGS. 6A to 6C are cross-sectional views of one embodiment of the present invention.

FIGS. 7A to 7D each illustrate one embodiment of an electronic device.

DETAILED DESCRIPTION OF THE INVENTION

Embodiments of the present invention will be described in detail below with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, an example of a method for manufacturing a top-gate transistor in which the condition of an interface between an oxide semiconductor layer and an insulating layer in contact with part of the oxide semiconductor layer is favorable will be described with reference to FIGS. 1A to 1C.

Figure 1A:
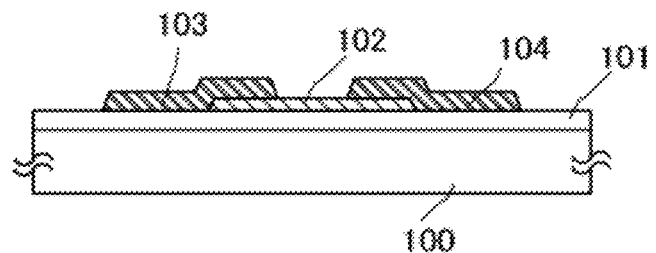
FIGS. 1A to 1C are cross-sectional views of one embodiment of the present invention.

As illustrated in FIG. 1A, a base insulating layer 101 is formed over a substrate 100.

As the substrate 100, a substrate of a glass material such as aluminosilicate glass, aluminoborosilicate glass, or barium borosilicate glass is used. In the mass production, a mother glass with the following size is preferably used for the substrate 100: the 8-th generation (2160 mm×2460 mm); the 9-th generation (2400 mm×2800 mm, or 2450 mm×3050 mm); the 10-th generation (2950 mm×3400 mm); or the like. The mother glass drastically shrinks when the treatment temperature is high and the treatment time is long. Thus, in the case where mass production is performed with the use of the mother glass, the preferable heating temperature in the manufacturing process is lower than or equal to 600° C., more preferably lower than or equal to 450° C.

The base insulating layer 101 can be formed to have a single-layer structure or a stacked-layer structure using one or more of silicon oxide, silicon oxynitride, silicon nitride oxide, aluminum oxide, aluminum oxynitride, gallium oxide, hafnium oxide, yttrium oxide, and the like by a CVD method, a sputtering method, or the like.

Next, an oxide semiconductor layer is formed over the base insulating layer 101. The oxide semiconductor layer is formed using any one of sputtering apparatuses such as an AC sputtering apparatus, a DC sputtering apparatus, and an RF sputtering apparatus. The oxide semiconductor layer is formed by a sputtering method under a mixed atmosphere containing an oxygen gas and a rare gas, a mixed atmosphere containing oxygen and nitrogen, and an atmosphere containing only a rare gas. For the oxide semiconductor layer, an indium oxide, a tin oxide, a zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga—based oxide; a three-component metal oxide such as a Sn—Ga—Zn-based oxide, an Al—Ga—Zn-based oxide, a Sn—Al—Zn-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as main components and there is no particular limitation on the ratio of In, Ga, and Zn. The In—Ga—Zn-based oxide may contain a metal element other than the In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In addition, at the formation of the oxide semiconductor layer, the pressure of a treatment chamber in a sputtering apparatus is set to less than 0.4 Pa, whereby mixing of an impurity such as alkali metal or hydrogen to a surface where a film is formed or a film to be formed can be suppressed. Note that hydrogen may be contained in the film to be formed as a hydrogen molecule, water, a hydroxyl group, or hydride in some cases in addition to a hydrogen atom.

In addition, at the formation of the oxide semiconductor layer, the distance between a target and the substrate (a T-S distance) is set to greater than or equal to 40 mm and less than or equal to 300 mm (preferably, greater than or equal to 60 mm).

In addition, at the formation of the oxide semiconductor layer by a sputtering method, the temperature of the surface where a film is formed is higher than or equal to 150° C. and lower than or equal to 450° C., preferably higher than or equal to 250° C. and lower than or equal to 320° C. The temperature at which entry of impurities such as water or hydrogen into a film to be formed is prevented and the impurity is released to a vapor phase in the chamber is 250° C. In addition, the upper limit of the temperature of the surface where a film is formed in the film formation by a sputtering method is the upper limit of the heat treatment temperature for the substrate or the upper limit of the temperature of the film to be formed (if the temperature exceeds the latter upper limit, components in the film significantly change).

Further, when the leakage rate of the treatment chamber of the sputtering apparatus is set to less than or equal to $1\times10^{-10}$ Pa·m$^3$/second at the formation of the oxide semiconductor layer, entry of an impurity such as an alkali metal or hydride into the oxide semiconductor layer that is being formed by a sputtering method can be reduced. Furthermore, with the use of an entrapment vacuum pump (e.g., a cryopump) as an evacuation system, counter flow of an impurity such as an alkali metal, a hydrogen atom, a hydrogen molecule, water, a hydroxyl group, or hydride from the evacuation system can be reduced.

Alternatively, at the formation of the oxide semiconductor layer, the film formation may be performed by introducing, for example, a nitrogen gas, an oxygen gas, an argon gas, or the like to the treatment chamber of the sputtering apparatus with the gas being heated.

Further, preheat treatment may be performed before formation of the oxide semiconductor layer, in order to remove moisture or hydrogen which remains on an inner wall of the sputtering apparatus, on a surface of the target, or inside the target material. As the preheat treatment, a method in which the inside of a film formation chamber is heated to 200° C. to 600° C. under a reduced pressure, a method in which introduction and evacuation of nitrogen or an inert gas are repeated while the inside of a film formation chamber is heated, and the like can be given. In this case, not water but oil or the like is preferably used as a coolant for the target. Although a certain level of advantageous effect can be obtained when introduction and evacuation of nitrogen are repeated without heating, it is more preferable to perform the treatment with the inside of the film formation chamber heated.

The base insulating layer 101 and the oxide semiconductor layer are preferably formed in succession without exposure to the air. With the successive formation, the respective interfaces of the stacked layers can be formed without being contaminated by an atmospheric component or a contamination impurity element floating in the air.

After the oxide semiconductor layer is formed, if necessary, heat treatment may be performed under an atmosphere which hardly contains hydrogen and moisture (a nitrogen atmosphere, an oxygen atmosphere, a dry-air atmosphere (e.g., as for moisture, a dew point is lower than or equal to −40° C., preferably lower than or equal to −60° C.), or the like) at a temperature higher than or equal to 150° C. and lower than or equal to 650° C., preferably a temperature higher than or equal to 200° C. and lower than or equal to 500° C. This heat treatment can be called dehydration or dehydrogenation, which is for detaching H, OH, or the like from the oxide semiconductor layer.

Next, the oxide semiconductor layer is processed, so that an island-like oxide semiconductor layer 102 is formed. The oxide semiconductor layer can be processed as follows: a mask having a desired shape is formed over the oxide semiconductor layer by a photolithography technique or an ink jet method; and the oxide semiconductor layer is selectively etched using the mask.

For the etching of the oxide semiconductor layer, either wet etching or dry etching may be employed. It is needless to say that both of them may be employed in combination.

Next, a conductive film is formed over the oxide semiconductor layer 102. The conductive film can be formed by a sputtering method or a vacuum evaporation method. As a material used for the conductive film, a metal material such as Al, Cr, Cu, Ta, Ti, Mo, and W, or an alloy material containing the metal material as a component is used. Further, a structure may be employed in which a layer of a high-melting point metal such as Cr, Ta, Ti, Mo, or W is stacked on a lower side and/or an upper side of a metal layer of Al, Cu, or the like. Furthermore, an Al material to which an element which prevents generation of hillocks or whisker in an Al film, such as Si, Ti, Ta, W, Mo, Cr, Nd, Sc, or Y is added may be used, leading to improvement in heat resistance.

For example, the metal conductive film preferably has a three-layer structure in which an aluminum layer is stacked over a titanium layer and a titanium layer is stacked over the aluminum layer, or a three layer structure in which an aluminum layer is stacked over a molybdenum layer and a molybdenum layer is stacked over the aluminum layer. Alternatively, the metal conductive film can have a two-layer structure in which an aluminum layer and a tungsten layer are stacked, or a two-layer structure in which an aluminum layer and a molybdenum layer are stacked. Needless to say, the metal conductive film may have a single-layer structure or a stacked-layer structure including four or more layers. Note that in the case where copper is used as one of the materials of the metal conductive film, the following stack may be used: an alloy layer of copper, magnesium, and aluminum is provided in contact with the oxide semiconductor layer; and a copper layer is provided in contact with the alloy layer of copper, magnesium, and aluminum.

Next, a source electrode layer 103 or a drain electrode layer 104 can be formed in such a manner that a mask having a desired shape is formed over the conductive film by a photolithography technique or an ink jet method, and the conductive film is selectively etched using the mask. Note that at the etching, part of the oxide semiconductor layer 102 may be etched.

Figure 1B:
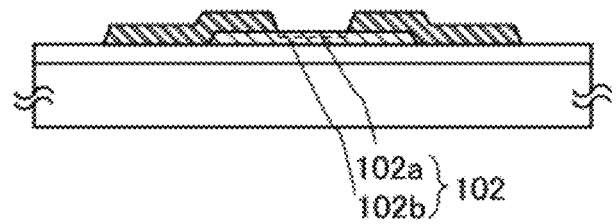

As illustrated in FIG. 1B, after the source electrode layer 103 or the drain electrode layer 104 is formed, heat treatment is performed under a reduced pressure. By the heat treatment under a reduced pressure, excessive hydrogen (including water and a hydroxyl group) contained in the oxide semiconductor layer 102 can be removed. After the heat treatment under a reduced pressure is performed, plasma treatment using a gas such as $N_2O$ or $N_2$ is performed. Nitrogen is added to the vicinity of the surface of the exposed oxide semiconductor layer 102 by performing the plasma treatment. The nitrogen concentration of an oxide semiconductor layer 102a to which nitrogen is added by the plasma treatment is higher than the nitrogen concentration of an oxide semiconductor layer 102b to which nitrogen is not added.

In the oxide semiconductor layer, the energy gap of a region containing much nitrogen (the oxide semiconductor layer 102a to which nitrogen is added) is smaller than the energy gap of a region containing less nitrogen (the oxide semiconductor layer 102b to which nitrogen is not added); thus, carriers easily flow through the region. Much nitrogen is contained in a region of the oxide semiconductor layer, where carriers flow, and less nitrogen is contained in other regions by adding nitrogen to the vicinity of the surface of the exposed oxide semiconductor layer by the plasma treatment.

Note that the plasma treatment using a gas such as $N_2O$ or $N_2$ may be performed before the source electrode layer or the drain electrode layer is formed in the film formation chamber of the sputtering apparatus, where the oxide semiconductor layer has been formed; or may be performed before a gate insulating layer is formed in a plasma CVD apparatus after the source electrode layer or the drain electrode layer is formed.

The oxide semiconductor layer 102a to which nitrogen is added has higher crystallinity than the oxide semiconductor layer 102b to which nitrogen is not added, and is c-axis aligned. Further, in the oxide semiconductor layer 102a to which nitrogen is added, the uniformity of the exposed surface region is increased.

A crystal contained in the oxide semiconductor layer 102a to which nitrogen is added has a hexagonal wurtzite crystal structure, and a crystal contained in the oxide semiconductor layer 102b to which nitrogen is not added has a hexagonal non-wurtzite crystal structure. Since both the wurtzite crystal structure and the non-wurtzite crystal structure are hexagonal crystal structures, a hexagonal lattice image can be seen from the c-axis direction.

Figure 1C:
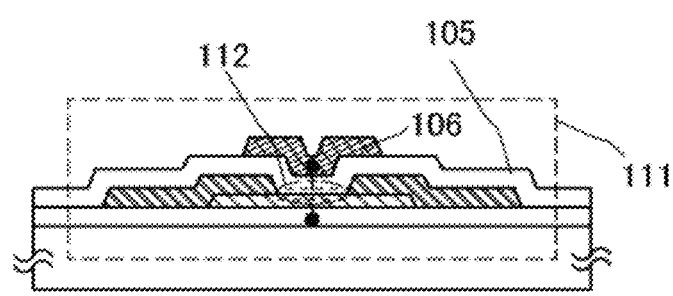

As illustrated in FIG. 1C, after the plasma treatment using a gas such as $N_2O$ or $N_2$ is performed, a gate insulating layer 105 which covers the source electrode layer 103 or the drain electrode layer 104 and is in contact with part of the oxide semiconductor layer 102 is formed without exposure to the air. The gate insulating layer 105 can be formed to have a single-layer structure or a stacked-layer structure using one or more of silicon oxide, silicon oxynitride, silicon nitride oxide, aluminum oxide, aluminum oxynitride, gallium oxide, hafnium oxide, yttrium oxide, and the like by a CVD method, a sputtering method, or the like. Note that a silicon oxynitride film (also referred to as $SiO_xN_y$ (x>y>0)) is more preferable as the gate insulating layer 105.

Note that in the case where residual nitrogen enters part of the gate insulating layer 105 or the entire gate insulating layer 105, the film quality of the gate insulating layer 105 might be degraded. Thus, the plasma treatment using a gas such as $N_2O$ or $N_2$ and the film formation of the gate insulating layer 105 may be performed in separate film formation chambers using a multi-chamber film formation apparatus or the like.

Next, a gate electrode layer 106 is formed over the gate insulating layer 105 so as to overlap the oxide semiconductor layer 102. The gate electrode layer 106 can be formed using a metal material such as titanium, molybdenum, chromium, tantalum, tungsten, copper, or aluminum, an alloy material thereof, or the like.

Between the gate electrode layer 106 and the gate insulating layer 105, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (InN, ZnN, or the like) is preferably provided as a material layer in contact with the gate insulating layer. These films each have a work function of 5 eV or higher, preferably 5.5 eV or higher; thus, the threshold voltage of the electric characteristics of the transistor can be positive. Accordingly, a so-called normally-off switching element can be obtained. For example, in the case where an In—Ga—Zn—O film containing nitrogen is used, an In—Ga—Zn—O film in which the nitrogen concentration is higher than or equal to $1 \times 10^{20}/cm^3$ and lower than 7 atomic % and at least higher than that the nitrogen concentration of the oxide semiconductor layer 102a is used.

The gate electrode layer 106 can be formed in such a manner that a conductive film is formed over the gate insulating layer 105, a mask having a desired shape is formed over the conductive film by a photolithography technique or an ink jet method, and the conductive film formed over the gate insulating layer 105 is selectively etched using the mask.

Through the above process, a top-gate transistor 111 in which the condition of the interface between the oxide semiconductor layer and the insulating layer in contact with part of the oxide semiconductor layer is favorable can be manufactured.

Figure 3A:
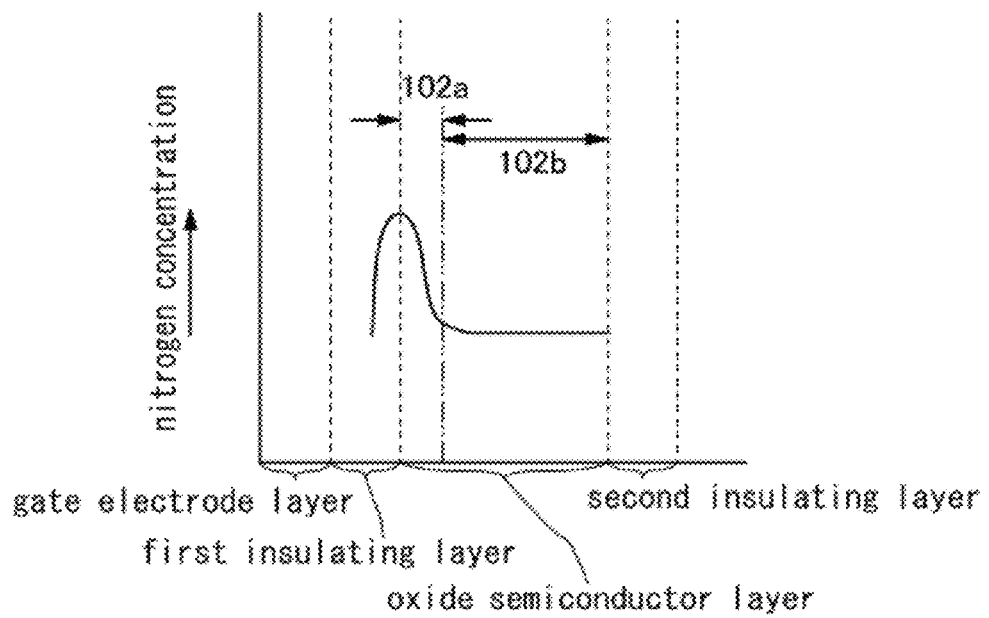
FIGS. 3A to 3C are examples of a model diagram of a concentration profile of one embodiment of the present invention.

Next, the state of the nitrogen concentration of the oxide semiconductor layer in the vicinity of the interface with the insulating layer in contact with the oxide semiconductor layer will be described in detail with reference to the nitrogen concentration profile illustrated in FIG. 3A. FIG. 3A is a schematic diagram illustrating the nitrogen concentration profile in the film thickness direction of a cross section taken along a dotted line in FIG. 1C. A first insulating layer and a second insulating layer in FIG. 3A correspond to the gate insulating layer and the base insulating layer in FIG. 1C, respectively.

As illustrated in FIG. 3A, the value of the nitrogen concentration of the oxide semiconductor layer 102b to which nitrogen is not added does not fluctuate much and is maintained constant. The nitrogen concentration of the oxide semiconductor layer 102a to which nitrogen is added is higher as closer to the interface between the oxide semiconductor layer and the first insulating layer. The nitrogen concentration has a peak at the interface between the oxide semiconductor layer and the first insulating layer.

Further, the nitrogen concentration of the first insulating layer is the highest at the interface with the oxide semiconductor layer, is gradually reduced at positions farther from the oxide semiconductor layer, and is reduced more greatly in a certain region.

The nitrogen concentration fluctuates in the vicinity of the interface between the oxide semiconductor layer 102a to which nitrogen is added and the oxide semiconductor layer 102b to which nitrogen is not added. The nitrogen concentration has such a concentration gradient due to the degree of crystallinity. The oxide semiconductor layer 102a to which nitrogen is added by the plasma treatment has higher crystallinity than the oxide semiconductor layer 102b to which nitrogen is not added. That is, the interface between the oxide semiconductor layer 102a to which nitrogen is added and the oxide semiconductor layer 102b to which nitrogen is not intentionally added is an interface between a region having high crystallinity and a region having low crystallinity. As a result, the nitrogen concentration fluctuates easily because the interface is relatively distinct.

Specifically, the nitrogen concentration of a region 112 in the vicinity of the interface between the first insulating layer and the oxide semiconductor layer is higher than or equal to $5 \times 10^{19}/cm^3$ and lower than 7 atomic %.

Further, specifically, the nitrogen concentration of the oxide semiconductor layer 102b to which nitrogen is not added by the plasma treatment is lower than $5 \times 10^{19}/cm^3$, preferably higher than or equal to $1 \times 10^{17}/cm^3$ and lower than $5 \times 10^{19}/cm^3$.

The nitrogen concentration has a peak at the interface between the oxide semiconductor layer and the first insulating layer; therefore, the crystallinity is the highest at the interface. As a result, interface states due to dangling bonds at the interface between the oxide semiconductor layer and the first insulating layer are reduced; therefore, a favorable condition of the interface can be realized. Thus, as compared to the case where the interface between the oxide semiconductor layer and the first insulating layer is in an amorphous state, the electric characteristics of the transistor can be prevented from being degraded.

In the transistor 111 having the nitrogen concentration profile illustrated in FIG. 3A, the nitrogen concentration of the region 112 in the vicinity of the interface between the first insulating layer and the oxide semiconductor layer is high. Thus, the region 112 in the vicinity of the interface has higher crystallinity than the crystallinity of other regions and is also c-axis aligned. Therefore, the transistor 111 with higher electric characteristics (e.g., the field-effect mobility and the threshold value) can be obtained. The region 112 in the vicinity of the interface also has higher uniformity than other regions; therefore, the transistor 111 with small variation in electric characteristics can be obtained.

Further, the transistor 111 is manufactured in which a channel region is included in a crystalline oxide semiconductor film having an a-b plane where bonds for forming hexagonal lattices are formed, which is substantially parallel to the plan surface of the substrate, and c-axes which are substantially perpendicular to the plan surface of the substrate, whereby the amount of fluctuation in the threshold voltage of the transistor 111 between before and after performance of a bias-thermal stress (BT) test or light irradiation test on the transistor 111 can be reduced. Accordingly, the transistor 111 with stable electric characteristics can be manufactured.

Embodiment 2

In this embodiment, an example of a method for manufacturing a bottom-gate transistor in which the condition of an interface between an oxide semiconductor layer and an insulating layer in contact with part of the oxide semiconductor layer is favorable will be described with reference to FIGS. 2A to 2C.

Figure 2A:
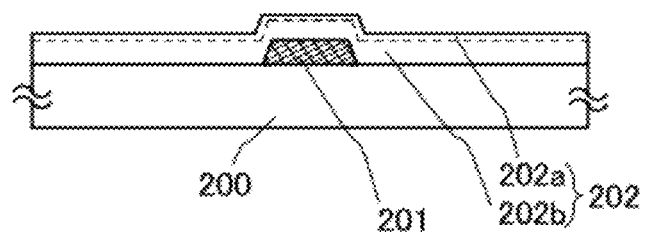
FIGS. 2A to 2C are cross-sectional views of one embodiment of the present invention.

As illustrated in FIG. 2A, a gate electrode layer 201 is formed over a substrate 200.

The gate electrode layer 201 can be formed using a metal material such as titanium, molybdenum, chromium, tantalum, tungsten, aluminum, or copper, an alloy material thereof, or the like. The gate electrode layer 201 can be formed in such a manner that a conductive film is formed over the substrate 200 by a sputtering method or a vacuum evaporation method, a mask is formed over the conductive film by a photolithography technique or an ink jet method, and the conductive film is etched using the mask.

Next, a gate insulating layer 202 covering the gate electrode layer 201 is formed. Note that a silicon oxynitride film (also referred to as $SiO_xN_y$ (x>y>0)) is more preferable as the gate insulating layer 202. After the gate insulating layer 202 is formed, plasma treatment using a gas such as $N_2O$ or $N_2$ is performed. Nitrogen is added to the vicinity of the surface of the gate insulating layer 202 by performing the plasma treatment. The nitrogen concentration of a gate insulating layer 202a to which nitrogen is added is higher than the nitrogen concentration of a gate insulating layer 202b to which nitrogen is not added.

Between the gate electrode layer 201 and the gate insulating layer, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—0 film containing nitrogen, a metal nitride film (InN, ZnN, or the like) is preferably provided as a material layer in contact with the gate insulating layer. These films each have a work function of 5 eV or higher, preferably 5.5 eV or higher; thus, the threshold voltage of the electric characteristics of the transistor can be positive. Accordingly, a so-called normally-off switching element can be obtained. For example, in the case where an In—Ga—Zn—O film containing nitrogen is used, an In—Ga—Zn—O film in which the nitrogen concentration higher than at least that of the oxide semiconductor layer 102, specifically an In—Ga—Zn—O film in which the nitrogen concentration is higher than or equal to 7 atomic % is used.

Note that in the case where residual nitrogen enters part of the gate insulating layer 202 or the entire gate insulating layer 202, the film quality of the gate insulating layer 202 might be degraded. Thus, the plasma treatment using a gas such as $N_2O$ or $N_2$ and the film formation of the gate insulating layer 202 may be performed in separate film formation chambers using a multi-chamber film formation apparatus or the like.

Note that the plasma treatment using a gas such as $N_2O$ or $N_2$ may be performed in a plasma CVD apparatus where the gate insulating layer has been formed; or may be performed before an oxide semiconductor layer is formed in a film formation chamber of a sputtering apparatus, where the oxide semiconductor layer is to be formed later.

Figure 2B:
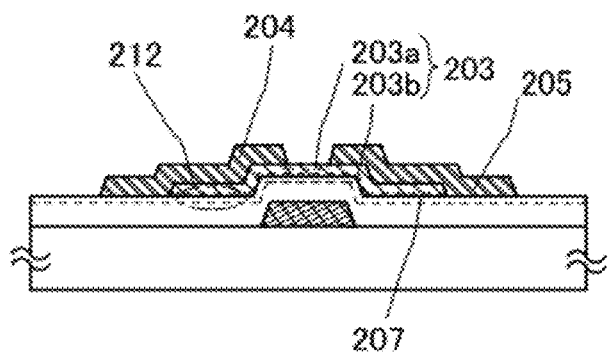

Next, as illustrated in FIG. 2B, an oxide semiconductor layer is formed over and in contact with the gate insulating layer 202. The oxide semiconductor layer is formed by a sputtering method under a mixed atmosphere containing an oxygen gas and a rare gas, a mixed atmosphere containing oxygen and nitrogen, and an atmosphere containing only a rare gas.

Next, the oxide semiconductor layer is processed, so that an island-like oxide semiconductor layer 203 is formed. The oxide semiconductor layer can be processed as follows: a mask having a desired shape is formed over the oxide semiconductor layer by a photolithography technique or an ink jet method; and the oxide semiconductor layer is selectively etched using the mask.

In such a manner, the oxide semiconductor layer 203 is provided in contact with the gate insulating layer 202*a* to which nitrogen is added, whereby an oxide semiconductor layer 207 having high crystallinity can be formed also in the vicinity of the interface of the oxide semiconductor layer 203 in contact with the gate insulating layer 202*a* to which nitrogen is added.

In the oxide semiconductor layer, the energy gap of a region containing much nitrogen (the oxide semiconductor layer 207 having high crystallinity) is smaller than the energy gap of a region containing less nitrogen; thus, carriers easily flow through the region. Much nitrogen is contained in a region of the oxide semiconductor layer, where carriers flow, and less nitrogen is contained in other regions by adding nitrogen to the vicinity of the surface of the gate insulating layer by the plasma treatment.

A crystal contained in the oxide semiconductor layer 207 having high crystallinity has a hexagonal wurtzite crystal structure.

That is, a region 212 in the vicinity of the interface between the gate insulating layer 202*a* to which nitrogen is added and the oxide semiconductor layer 203 has higher crystallinity than other regions. Further, the region 212 in the vicinity of the interface has higher uniformity than other regions. Furthermore, interface states due to dangling bonds at the interface between the gate insulating layer 202 and the oxide semiconductor layer 203 are reduced; therefore, a favorable condition of the interface can be realized.

Next, a conductive film is formed over the oxide semiconductor layer 203. The conductive film can be formed by a sputtering method or a vacuum evaporation method. As a material used for the conductive film, a metal material such as Al, Cu, Cr, Ta, Ti, Mo, and W, or an alloy material containing the metal material as a component is used. Further, a structure may be employed in which a layer of a high-melting point metal such as Cr, Ta, Ti, Mo, or W is stacked on a lower side and/or an upper side of a metal layer of Al, Cu, or the like.

Next, a source electrode layer 204 or a drain electrode layer 205 can be formed in such a manner that a mask having a desired shape is formed over the conductive film by a photolithography technique or an ink jet method, and the conductive film is selectively etched using the mask. Note that at the etching, part of the oxide semiconductor layer 203 may be etched.

After the source electrode layer 204 or the drain electrode layer 205 is formed, heat treatment is performed under a reduced pressure. By the heat treatment under a reduced pressure, excessive hydrogen (including water and a hydroxyl group) contained in the oxide semiconductor layer 203 can be removed. After the heat treatment under a reduced pressure is performed, oxygen plasma treatment is performed. Oxygen is added to the vicinity of the surface of the exposed oxide semiconductor layer 203 by performing the oxygen plasma treatment. The oxygen concentration of an oxide semiconductor layer 203*a* to which oxygen is added is higher than the oxygen concentration of an oxide semiconductor layer 203*b* to which oxygen is not added.

Figure 2C:
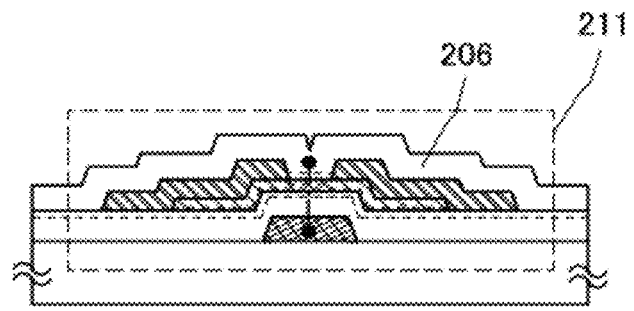

As illustrated in FIG. 2C, after the oxygen plasma treatment is performed, a protective insulating layer 206 which covers the source electrode layer 204 or the drain electrode layer 205 and is in contact with part of the oxide semiconductor layer 203 is formed by a sputtering method. The protective insulating layer 206 from which part of contained oxygen is released by heat treatment is easily formed by a sputtering method, which is preferable. When the protective insulating layer 206 from which part of contained oxygen is released by heat treatment is formed by a sputtering method, the amount of oxygen contained in a film formation gas is preferably large, and oxygen, a mixed gas of oxygen and a rare gas, or the like can be used. Typically, the oxygen concentration of a film formation gas is preferably higher than or equal to 6% and lower than or equal to 100%.

As the protective insulating layer 206, a single layer or a stacked layer selected from silicon oxide, silicon oxynitride, silicon nitride, silicon nitride oxide, aluminum oxide, aluminum oxynitride, aluminum gallium oxide, and gallium oxide can be used.

Note that the thickness of the protective insulating layer 206 is greater than or equal to 50 nm, preferably greater than or equal to 200 nm and less than or equal to 500 nm. With the thick protective insulating layer 206, the amount of oxygen released from the protective insulating layer 206 can be increased, and thus the increase makes it possible to reduce defects at the interface between the protective insulating layer 206 and the oxide semiconductor layer 203.

After the protective insulating layer 206 is formed, if necessary, heat treatment may be performed under an atmosphere which hardly contains hydrogen and moisture (a nitrogen atmosphere, an oxygen atmosphere, a dry-air atmosphere (e.g., as for moisture, a dew point is lower than or equal to −40° C., preferably lower than or equal to −60° C.), or the like) at a temperature higher than or equal to 150° C. and lower than or equal to 650° C., preferably a temperature higher than or equal to 200° C. and lower than or equal to 500° C.

Through the above process, a bottom-gate transistor 211 in which the condition of the interface between the oxide semiconductor layer and the insulating layer in contact with the oxide semiconductor layer is favorable can be manufactured.

Figure 3B:
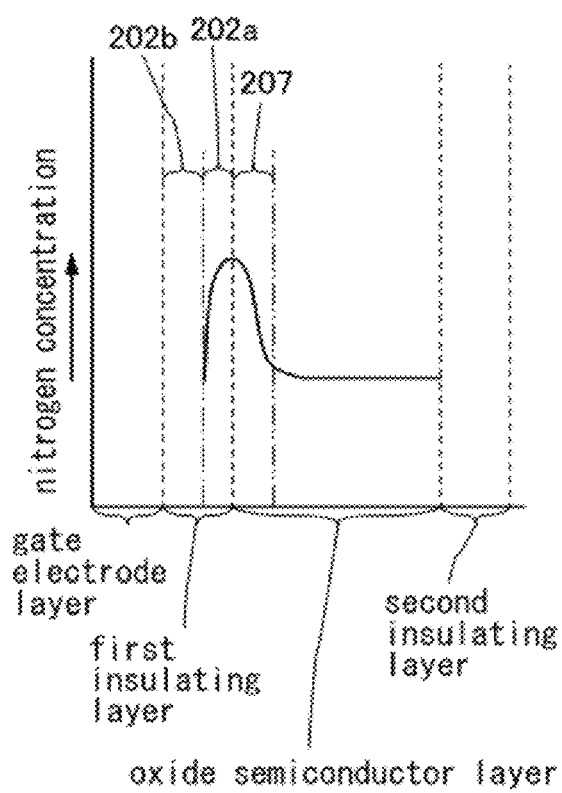
Figure 3C:
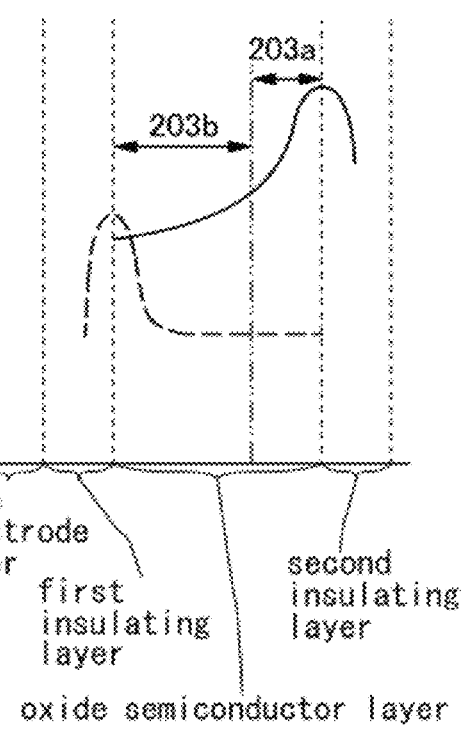

Next, the state of the nitrogen concentration of the oxide semiconductor layer in the vicinity of the interface with the insulating layer in contact with the oxide semiconductor layer will be described in detail with reference to the nitrogen concentration profile illustrated in FIG. 3B. In addition, the state of the oxygen concentration of the oxide semiconductor layer in the vicinity of the interface with the insulating layer in contact with the oxide semiconductor layer will be described in detail with reference to the oxygen concentration profile illustrated in FIG. 3C. FIG. 3B is a schematic diagram illustrating the nitrogen concentration profile in the film thickness direction of a cross section taken along a dotted line in FIG. 2C, and FIG. 3C is a schematic diagram illustrating the oxygen concentration profile in the film thickness direction of a cross section taken along a dotted line in FIG. 2C. A first insulating layer and a second insulating layer in each of FIGS. 3B and 3C correspond to the gate insulating layer and the protective insulating layer in FIG. 2C, respectively. Note that in FIGS. 3B and 3C, the nitrogen concentration and the oxygen concentration are each a different concentration. The nitrogen concentration profile in FIG. 3B and the oxygen concentration profile in FIG. 3C are schematic diagrams illustrating the respective relative relations, and FIGS. 3B and 3C does not illustrate which of the concentrations is, for example, high or low. For the purpose of comparison of profiles, FIG. 3C includes the nitrogen concentration profile of FIG. 3B.

As illustrated in FIG. 3B, the nitrogen concentration of the gate insulating layer 202a to which nitrogen is added becomes higher and becomes gradually higher as closer to the interface between the first insulating layer and the oxide semiconductor layer. The nitrogen concentration has a peak at the interface between the first insulating layer and the oxide semiconductor layer.

Further, the nitrogen concentration of the oxide semiconductor layer 207 having high crystallinity is the highest at the interface with the first insulating layer, is gradually reduced at positions farther from the first insulating layer, and is reduced more greatly in a certain region. The value of the nitrogen concentration of the oxide semiconductor layer except for the oxide semiconductor layer 207 having high crystallinity does not fluctuate much and is maintained constant.

The oxide semiconductor layer 203 is provided in contact with the gate insulating layer 202a to which nitrogen is added, whereby the region 212 in the vicinity of the interface between the gate insulating layer 202a to which nitrogen is added and the oxide semiconductor layer 203 has higher crystallinity than other regions. As a result, the nitrogen concentration fluctuates easily because an interface between a region having high crystallinity and a region having low crystallinity is relatively distinct.

Specifically, the nitrogen concentration of the region 212 in the vicinity of the interface between the first insulating layer and the oxide semiconductor layer is higher than or equal to $5 \times 10^{19}/cm^3$ and lower than 7 atomic %.

Further, specifically, the nitrogen concentration of the oxide semiconductor layer other than the oxide semiconductor layer 207 having high crystallinity is higher than or equal to $1 \times 10^{17}/cm^3$ and lower than $5 \times 10^{19}/cm^3$.

As illustrated in FIG. 3C, the oxygen concentration of the oxide semiconductor layer becomes gradually higher as closer to the second insulating layer. The oxygen concentration has a peak at the interface between the second insulating layer and the oxide semiconductor layer.

Further, the oxygen concentration of the second insulating layer is the highest in a region on the oxide semiconductor layer side, and is gradually reduced at positions farther from the oxide semiconductor layer.

The oxygen concentration of the oxide semiconductor layer fluctuates gradually. The oxygen concentration has such a gradual concentration gradient due to the interface between the oxide semiconductor layer 203a to which oxygen is added and the oxide semiconductor layer 203b to which oxygen is not added, which is ambiguous.

The nitrogen concentration has a peak at the interface between the oxide semiconductor layer and the first insulating layer; therefore, the crystallinity is the highest at the interface. As a result, interface states due to dangling bonds at the interface between the oxide semiconductor layer and the first insulating layer are reduced; therefore, a favorable condition of the interface can be realized. Thus, as compared to the case where the interface between the oxide semiconductor layer and the first insulating layer is in an amorphous state, the electric characteristics of the transistor can be prevented from being degraded.

In the transistor 211 having the nitrogen concentration profile illustrated in FIG. 3B, the nitrogen concentration of the region 212 in the vicinity of the interface between the first insulating layer and the oxide semiconductor layer is high. Thus, the region 212 in the vicinity of the interface has higher crystallinity than other regions and is also c-axis aligned.

Therefore, the transistor 211 with higher electric characteristics (e.g., the field-effect mobility and the threshold value) can be obtained. The region 212 in the vicinity of the interface also has higher uniformity than other regions; therefore, the transistor 211 with small variation in electric characteristics can be obtained.

Further, the transistor 211 is manufactured in which a channel region is included in a crystalline oxide semiconductor film having an a-b plane where bonds for forming hexagonal lattices are formed, which is substantially parallel to the plan surface of the substrate, and c-axes which are substantially perpendicular to the plan surface of the substrate, whereby the amount of fluctuation in the threshold voltage of the transistor 211 between before and after performance of a bias-thermal stress (BT) test or light irradiation test on the transistor 211 can be reduced. Accordingly, the transistor 211 with stable electric characteristics can be manufactured.

Figure 4A:
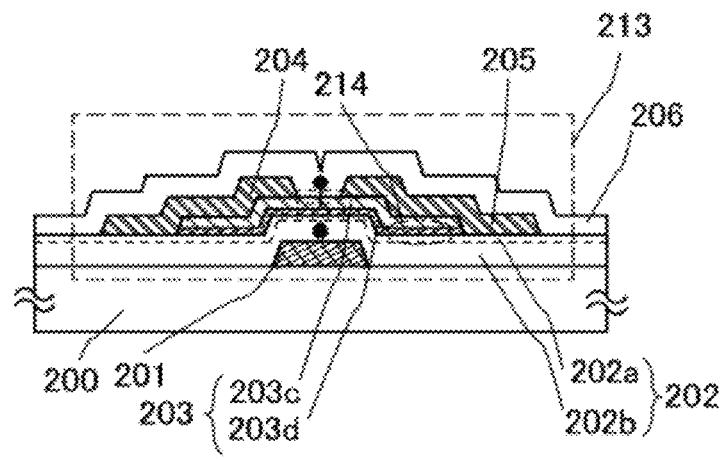
FIGS. 4A and 4B are a cross-sectional view of one embodiment of the present invention and an example of a model diagram of a concentration profile of one embodiment of the present invention, respectively.
Figure 4B:
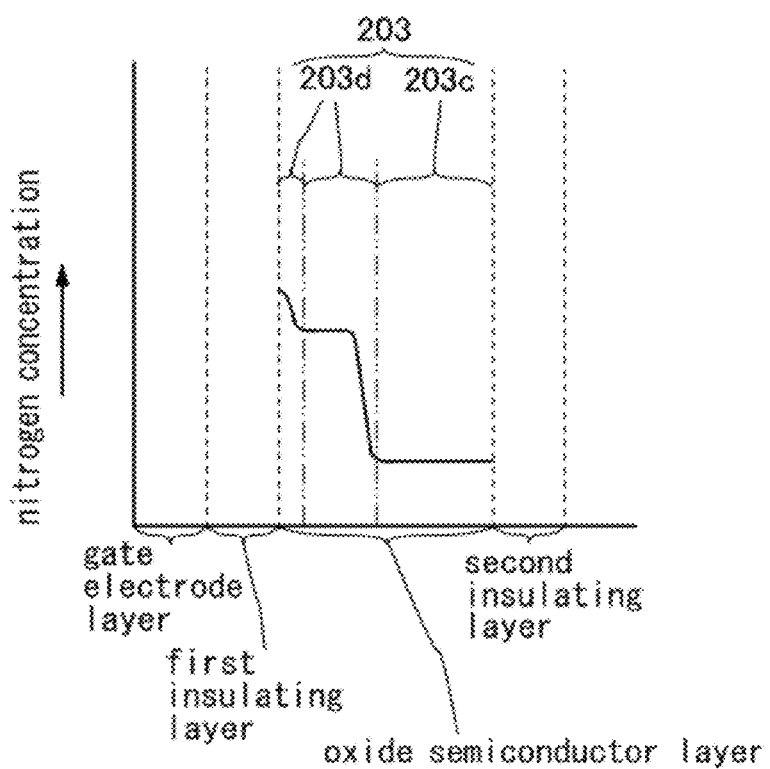

Note that as illustrated in FIGS. 4A and 4B, when an oxide semiconductor layer 203 is formed, the oxide semiconductor layer 203 may be formed in a stack by changing film formation conditions plural times. After an oxide semiconductor layer 203d having a high nitrogen concentration is formed, an oxide semiconductor layer 203c may be formed over and in contact with the oxide semiconductor layer 203d having a high nitrogen concentration.

In this case, for example, the oxide semiconductor layer 203d having a high nitrogen concentration may be formed to a thickness of greater than or equal to 1 nm and less than or equal to 10 nm by a sputtering method using only a nitrogen gas, and the oxide semiconductor layer 203c may be formed by a sputtering method under a mixed atmosphere containing an oxygen gas and a rare gas, a mixed atmosphere containing oxygen and nitrogen, and an atmosphere containing only a rare gas. The oxide semiconductor layer 203d having a high nitrogen concentration and the oxide semiconductor layer 203c can be formed by switching the kinds of gases introduced into the film formation chamber; therefore, the nitrogen concentration and the oxygen concentration can be controlled easily and high mass productivity can be realized.

In the oxide semiconductor layer, the energy gap of a region containing much nitrogen (the oxide semiconductor layer 203d having a high nitrogen concentration) is smaller than the energy gap of a region containing less nitrogen (the oxide semiconductor layer 203c); thus, carriers easily flow through the region. Much nitrogen can be contained in a region of the oxide semiconductor layer, where carriers flow, and less nitrogen can be contained in other regions by switching the kinds of gases introduced into the film formation chamber and forming the oxide semiconductor layer in a stacked-layer structure.

A crystal contained in the oxide semiconductor layer 203d having a high nitrogen concentration has a hexagonal wurtzite crystal structure, and a crystal contained in the oxide semiconductor layer 203c has a hexagonal non-wurtzite crystal structure. Since both the wurtzite crystal structure and the non-wurtzite crystal structure are hexagonal crystal structures, a hexagonal lattice image can be seen from the c-axis direction.

As illustrated in FIG. 4A, in the case where the oxide semiconductor layer 203d having a high nitrogen concentration is provided over and in contact with the gate insulating layer 202a to which nitrogen is added, the crystallinity of a region 214 in the vicinity of the interface can be controlled more easily than the case where the oxide semiconductor layer 203 is formed over and in contact with the gate insulating layer 202a to which nitrogen is added, as illustrated in FIGS. 2A to 2C.

At the formation of the oxide semiconductor layer 203d having a high nitrogen concentration, the gas flow rate of nitrogen which is introduced at the film formation, or the like is controlled, whereby the control of the degree of crystallinity, the crystal structure, and the various parameters involved in the crystal structure can be changed.

Next, the state of the nitrogen concentration of the oxide semiconductor layer in the vicinity of the interface with the insulating layer in contact with the oxide semiconductor layer can be described with reference to the nitrogen concentration profile illustrated in FIG. 4B. FIG. 4B is a schematic diagram illustrating the nitrogen concentration profile in the film thickness direction in a cross section taken along a dotted line in FIG. 4A. A first insulating layer and a second insulating layer in FIG. 4B correspond to the gate insulating layer and the protective insulating layer in FIG. 4A, respectively.

As illustrated in FIG. 4B, the value of the nitrogen concentration of the oxide semiconductor layer 203c does not fluctuate much and is maintained constant.

The nitrogen concentration of the region 214 in the vicinity of the interface is increased stepwise. Specifically, the nitrogen concentration of the region 214 in the vicinity of the interface is increased in two phases as closer to the first insulating layer. It is the interface between the oxide semiconductor layer 203c and the oxide semiconductor layer 203d having a high nitrogen concentration at which the nitrogen concentration is increased at first. The value of the nitrogen concentration which is once increased does not fluctuate much and is maintained constant. Further, the oxide semiconductor layer 203d having a high nitrogen concentration is in contact with the gate insulating layer 202a to which nitrogen is added; therefore, regions in which the progress speed of crystallization differ is formed in the oxide semiconductor layer 203d having a high nitrogen concentration. Thus, it is the interface between the regions in which the progress speed of crystallization differ in the oxide semiconductor layer 203d having a high nitrogen concentration at which the nitrogen concentration is increased the second.

The progress speed of crystallization differs in the oxide semiconductor layer 203d having a high nitrogen concentration because the oxide semiconductor layer 203d having a high nitrogen concentration is not in contact with the gate insulating layer 202b to which nitrogen is not added but is in contact with the gate insulating layer 202a to which nitrogen is added. When the oxide semiconductor layer 203d having a high nitrogen concentration is formed over and in contact with the gate insulating layer 202a to which nitrogen is added, there is a difference in the progress speed of crystallization in the oxide semiconductor layer 203d having a high nitrogen concentration.

As compared to the interface between the oxide semiconductor layer and the first insulating layer in FIG. 3B, the interface between the oxide semiconductor layer and the first insulating layer in FIG. 4B contains much nitrogen and thus crystallization progresses easily.

The nitrogen concentration has a peak at the interface between the oxide semiconductor layer and the first insulating layer; therefore, the crystallinity is the highest at the interface. In addition, the peak value of the nitrogen concentration is higher than the peak value of the nitrogen concentration in FIG. 3B. As a result, interface states due to dangling bonds at the interface between the oxide semiconductor layer and the first insulating layer are reduced; therefore, a favorable condition of the interface can be realized. Thus, as compared to the case where the interface between the oxide semiconductor layer and the first insulating layer is in an amorphous state, the electric characteristics of the transistor can be prevented from being degraded.

Further, in a transistor 213 having the nitrogen concentration profile illustrated in FIG. 4B, the nitrogen concentration of the region 214 in the vicinity of the interface between the first insulating layer and the oxide semiconductor layer is high, and further the nitrogen concentration at the interface between the first insulating layer and the oxide semiconductor layer is much higher. Thus, the region 214 in the vicinity of the interface has higher crystallinity than other regions. The region 214 in the vicinity of the interface has an a-b plane where bonds for forming hexagonal lattices are formed, which is substantially parallel to the plan surface of the substrate, and c-axes which are substantially perpendicular to the plan surface of the substrate. Therefore, the transistor 213 with higher electric characteristics (e.g., the field-effect mobility and the threshold value) can be obtained. The region 214 in the vicinity of the interface also has higher uniformity than other regions; therefore, the transistor 213 with small variation in electric characteristics can be obtained.

Further, the transistor 213 is manufactured in which a channel region is included in a crystalline oxide semiconductor film having an a-b plane where bonds for forming hexagonal lattices are formed, which is substantially parallel to the plan surface of the substrate, and c-axes which are substantially perpendicular to the plan surface of the substrate, whereby the amount of fluctuation in the threshold voltage of the transistor 213 between before and after performance of a bias-thermal stress (BT) test or light irradiation test on the transistor 213 can be reduced. Accordingly, the transistor 213 with stable electric characteristics can be manufactured.

Embodiment 3

In this embodiment, an example of a method for manufacturing a bottom-gate transistor in which the condition of an interface between an oxide semiconductor layer and an insulating layer in contact with part of the oxide semiconductor layer is favorable will be described with reference to FIGS. 8A to 8C.

Figure 8A:
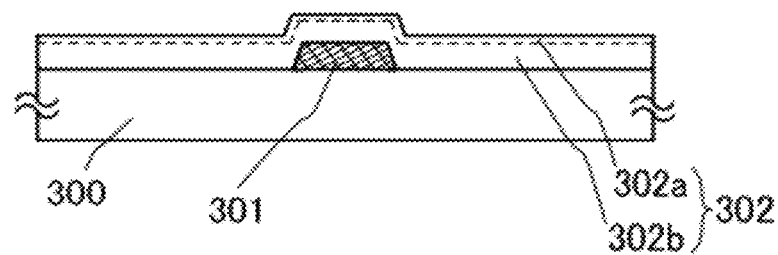
FIGS. 8A to 8C are cross-sectional views of one embodiment of the present invention.

As illustrated in FIG. 8A, a gate electrode layer 301 is formed over a substrate 300.

The gate electrode layer 301 can be formed using a metal material such as titanium, molybdenum, chromium, tantalum, tungsten, aluminum, or copper, an alloy material thereof, or the like. The gate electrode layer 301 can be formed in such a manner that a conductive film is formed over the substrate 300 by a sputtering method or a vacuum evaporation method, a mask is formed over the conductive film by a photolithography technique or an ink jet method, and the conductive film is etched using the mask.

Next, a gate insulating layer 302 covering the gate electrode layer 301 is formed. Note that a silicon oxynitride film (also referred to as $SiO_xN_y$ (x>y>0)) is more preferable as the gate insulating layer 302. After the gate insulating layer 302 is formed, plasma treatment using a gas such as $N_2O$ or $N_2$ is performed. Nitrogen is added to the vicinity of the surface of the gate insulating layer 302 by performing the plasma treatment. The nitrogen concentration of a gate insulating layer 302a to which nitrogen is added is higher than the nitrogen concentration of a gate insulating layer 302b to which nitrogen is not added.

Note that in the case where residual nitrogen enters part of the gate insulating layer 302 or the entire gate insulating layer 302, the film quality of the gate insulating layer 302 might be degraded. Thus, the plasma treatment using a gas such as $N_2O$ or $N_2$ and the film formation of the gate insulating layer 302 may be performed in separate film formation chambers using a multi-chamber film formation apparatus or the like.

Note that the plasma treatment using a gas such as $N_2O$ or $N_2$ may be performed in a plasma CVD apparatus where the gate insulating layer has been formed; or may be performed before an oxide semiconductor layer is formed in a film formation chamber of a sputtering apparatus, where the oxide semiconductor layer is to be formed later.

Figure 8B:
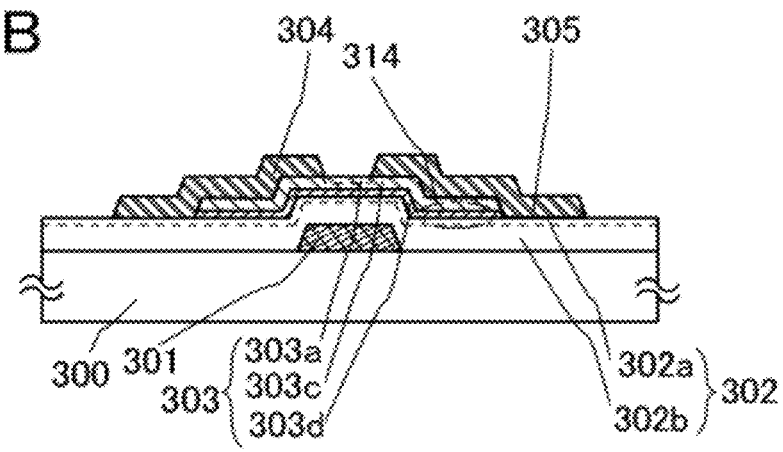

Next, as illustrated in FIG. 8B, an oxide semiconductor layer is formed over and in contact with the gate insulating layer 302. Note that at the formation of an oxide semiconductor layer 303, an oxide semiconductor layer 303d having a high nitrogen concentration and an oxide semiconductor layer 303c can be formed by switching the kinds of gases introduced into the film formation chamber. First, only a nitrogen gas is introduced into the film formation chamber and then halfway through the process the kinds of gases introduced into the film formation chamber is switched, whereby the oxide semiconductor layer is formed by a sputtering method under a mixed atmosphere containing an oxygen gas and a rare gas, a mixed atmosphere containing oxygen and nitrogen, and an atmosphere containing only a rare gas.

In addition, at the formation of the oxide semiconductor layer, the pressure of a treatment chamber in a sputtering apparatus is set to less than 0.7 Pa, preferably from 0.1 Pa to 0.5 Pa, whereby mixing of an impurity such as alkali metal or hydrogen to a surface where a film is formed or a film to be formed can be suppressed. Note that hydrogen may be contained in the film to be formed as a hydrogen molecule, water, a hydroxyl group, or hydride in some cases, in addition to a hydrogen atom.

Further, at the formation of the oxide semiconductor layer, the film formation is performed by introducing, for example, a nitrogen gas, an oxygen gas, an argon gas, or the like to the treatment chamber of the sputtering apparatus with the gas being heated. Crystallization can progress gradually from a region in contact with the gate insulating layer 302 by performing the film formation during the heating. Thus, with the formation by sputtering performed only once, consequently, the oxide semiconductor layer 303d having a high nitrogen concentration and the oxide semiconductor layer 303c can be stacked.

Next, the oxide semiconductor layer is processed, so that an island-like oxide semiconductor layer 303 is formed. The oxide semiconductor layer can be processed as follows: a mask having a desired shape is formed over the oxide semiconductor layer by a photolithography technique or an ink jet method; and the oxide semiconductor layer is selectively etched using the mask.

In the oxide semiconductor layer, the energy gap of a region containing much nitrogen (the oxide semiconductor layer 303d having a high nitrogen concentration) is smaller than the energy gap of a region containing less nitrogen (the oxide semiconductor layer 303c); thus, carriers easily flow through the region. Much nitrogen can be contained in a region of the oxide semiconductor layer, where carriers flow, and less nitrogen can be contained in other regions by forming the oxide semiconductor layer 303d having a high nitrogen concentration and the oxide semiconductor layer 303c in such a manner that the kinds of gases introduced into the film formation chamber are switched and the film formation is performed during heating.

At the formation of the oxide semiconductor layer 303d having a high nitrogen concentration, the gas flow rate of nitrogen which is introduced at the film formation or the like is controlled, whereby the control of the degree of crystallinity, the crystal structure, and the various parameters involved in the crystal structure can be changed.

A crystal contained in the oxide semiconductor layer 303d having a high nitrogen concentration has a hexagonal wurtzite crystal structure, and a crystal contained in the oxide semiconductor layer 303c has a hexagonal non-wurtzite crystal structure. Since both the wurtzite crystal structure and the non-wurtzite crystal structure are hexagonal crystal structures, a hexagonal lattice image can be seen from the c-axis direction.

That is, a region 314 in the vicinity of the interface between the gate insulating layer 302a to which nitrogen is added and the oxide semiconductor layer 303 has higher crystallinity than other regions. Further, the region 314 in the vicinity of the interface has higher uniformity than other regions. Furthermore, interface states due to dangling bonds at the interface between the gate insulating layer 302 and the oxide semiconductor layer 303 are reduced; therefore, a favorable condition of the interface can be realized.

Next, a conductive film is formed over the oxide semiconductor layer 303. The conductive film can be formed by a sputtering method or a vacuum evaporation method. As a material used for the conductive film, a metal material such as Al, Cu, Cr, Ta, Ti, Mo, and W, or an alloy material containing the metal material as a component is used. Further, a structure may be employed in which a layer of a high-melting point metal such as Cr, Ta, Ti, Mo, or W is stacked on a lower side and/or an upper side of a metal layer of Al, Cu, or the like.

Next, a source electrode layer 304 or a drain electrode layer 305 can be formed in such a manner that a mask having a desired shape is formed over the conductive film by a photolithography technique or an ink jet method, and the conductive film is selectively etched using the mask. Note that at the etching, part of the oxide semiconductor layer 303 may be etched.

After the source electrode layer 304 or the drain electrode layer 305 is formed, heat treatment is performed under a reduced pressure. By the heat treatment under a reduced pressure, excessive hydrogen (including water and a hydroxyl group) contained in the oxide semiconductor layer 303 can be removed. After the heat treatment under a reduced pressure is performed, oxygen plasma treatment is performed. Oxygen is added to the vicinity of the surface of the exposed oxide semiconductor layer 303 by performing the oxygen plasma treatment. The oxygen concentration of an oxide semiconductor layer 303a to which oxygen is added is higher than the oxygen concentration of the oxide semiconductor layer 303c to which oxygen is not added.

Figure 8C:
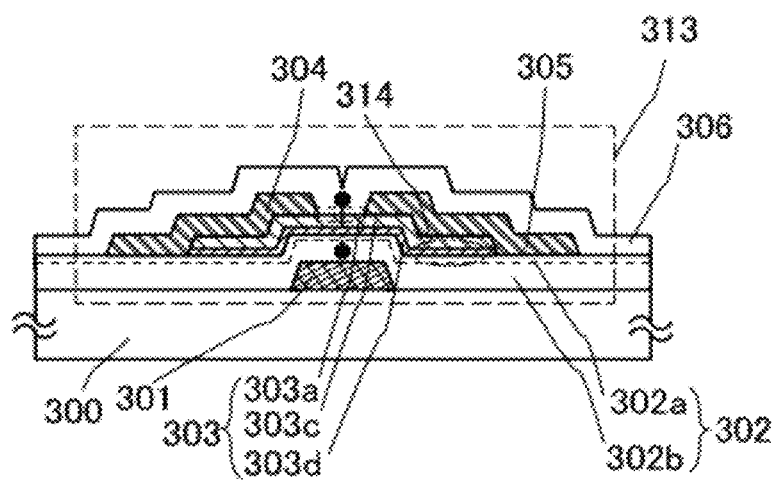

As illustrated in FIG. 8C, after the oxygen plasma treatment is performed, a protective insulating layer 306 which covers the source electrode layer 304 or the drain electrode layer 305 and is in contact with part of the oxide semiconductor layer 303 is formed by a sputtering method. The protective insulating layer 306 from which part of contained oxygen is released by heat treatment is easily formed by a sputtering method, which is preferable. When the protective insulating layer 306 from which part of contained oxygen is released by heat treatment is formed by a sputtering method, the amount of oxygen contained in a film formation gas is preferably large, and oxygen, a mixed gas of oxygen and a rare gas, or the like can be used. Typically, the oxygen concentration of a film formation gas is preferably higher than or equal to 6% and lower than or equal to 100%.

As the protective insulating layer 306, a stacked-layer structure including one or more of silicon oxide, silicon oxynitride, silicon nitride, silicon nitride oxide, aluminum oxide, aluminum oxynitride, aluminum gallium oxide, and gallium oxide can be used.

Note that the thickness of the protective insulating layer 306 is greater than or equal to 50 nm, preferably greater than or equal to 200 nm and less than or equal to 500 nm. With the thick protective insulating layer 306, the amount of oxygen released from the protective insulating layer 306 can be increased, and thus the increase makes it possible to reduce defects at the interface between the protective insulating layer 306 and the oxide semiconductor layer 303.

After the protective insulating layer 306 is formed, if necessary, heat treatment may be performed under an atmosphere which hardly contains hydrogen and moisture (a nitrogen atmosphere, an oxygen atmosphere, a dry-air atmosphere (e.g., as for moisture, a dew point is lower than or equal to −40° C., preferably lower than or equal to −60° C.), or the like) at a temperature higher than or equal to 150° C. and lower than or equal to 650° C., preferably a temperature higher than or equal to 200° C. and lower than or equal to 500° C.

Through the above process, a bottom-gate transistor 313 in which the condition of the interface between the oxide semiconductor layer and the insulating layer in contact with the oxide semiconductor layer is favorable can be manufactured.

Figure 9:
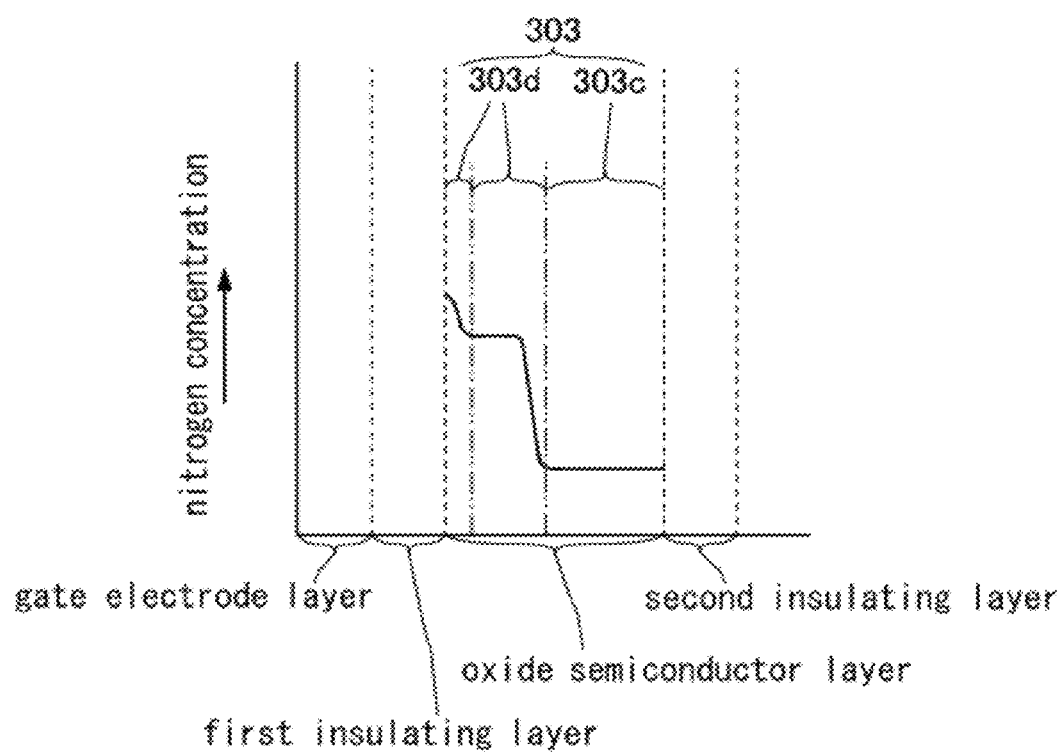
FIG. 9 is an example of a model diagram of a concentration profile of one embodiment of the present invention.

Next, the state of the nitrogen concentration of the oxide semiconductor layer in the vicinity of the interface with the insulating layer in contact with the oxide semiconductor layer will be described in detail with reference to the nitrogen concentration profile illustrated in FIG. 9. FIG. 9 is a schematic diagram illustrating the nitrogen concentration profile in the film thickness direction of a cross section taken along a dotted line in FIG. 8C. A first insulating layer and a second insulating layer in FIG. 9 correspond to the gate insulating layer and the protective insulating layer in FIG. 8C, respectively.

As illustrated in FIG. 9, the value of the nitrogen concentration of the oxide semiconductor layer 303c does not fluctuate much and is maintained substantially constant.

The nitrogen concentration of the region 314 in the vicinity of the interface is increased stepwise. Specifically, the nitrogen concentration of the region 314 in the vicinity of the interface is increased in two phases as closer to the first insulating layer. It is the interface between the oxide semiconductor layer 303c and the oxide semiconductor layer 303d having a high nitrogen concentration at which the nitrogen concentration is increased at first. The value of the nitrogen concentration which is once increased does not fluctuate much and is maintained substantially constant. Further, the oxide semiconductor layer 303d having a high nitrogen concentration is in contact with the gate insulating layer 302a to which nitrogen is added; therefore, regions in which the progress speed of crystallization differ are formed in the oxide semiconductor layer 303d having a high nitrogen concentration. Thus, it is the interfaces between the regions in which the progress speed of crystallization differ in the oxide semiconductor layer 303d having a high nitrogen concentration at which the nitrogen concentration is increased the second.

The progress speed of crystallization differs in the oxide semiconductor layer 303d having a high nitrogen concentration because the oxide semiconductor layer 303d having a high nitrogen concentration is not in contact with the gate insulating layer 302b to which nitrogen is not added but is in contact with the gate insulating layer 302a to which nitrogen is added. When the oxide semiconductor layer 303d having a high nitrogen concentration is formed over and in contact with the gate insulating layer 302a to which nitrogen is added, there is a difference in the progress speed of crystallization in the oxide semiconductor layer 303d having a high nitrogen concentration.

As compared to the interface between the oxide semiconductor layer and the first insulating layer in FIG. 3B, the interface between the oxide semiconductor layer and the first insulating layer in FIG. 9 contains much nitrogen and thus crystallization progresses easily.

The nitrogen concentration has a peak at the interface between the oxide semiconductor layer and the first insulating layer; therefore, the crystallinity is the highest at the interface. In addition, the peak value of the nitrogen concentration is higher than the peak value of the nitrogen concentration in FIG. 3B. As a result, interface states due to dangling bonds at the interface between the oxide semiconductor layer and the first insulating layer are reduced; therefore, a favorable condition of the interface can be realized. Thus, as compared to the case where the interface between the oxide semiconductor layer and the first insulating layer is in an amorphous state, the electric characteristics of the transistor can be prevented from being degraded.

Further, in the transistor 313 having the nitrogen concentration profile illustrated in FIG. 9, the nitrogen concentration of the region 314 in the vicinity of the interface between the first insulating layer and the oxide semiconductor layer is high, and further the nitrogen concentration at the interface between the first insulating layer and the oxide semiconductor layer is much higher. Thus, the region 314 in the vicinity of the interface has higher crystallinity than other regions and is also c-axis aligned. Therefore, the transistor 313 with higher electric characteristics (e.g., the field-effect mobility and the threshold value) can be obtained. The region 314 in the vicinity of the interface also has higher uniformity than other regions; therefore, the transistor 313 with small variation in electric characteristics can be obtained.

Further, the transistor 313 is manufactured in which a channel region is included in a crystalline oxide semiconductor film having an a-b plane where bonds for forming hexagonal lattices are formed, which is substantially parallel to the plan surface of the substrate, and c-axes which are substantially perpendicular to the plan surface of the substrate, whereby the amount of fluctuation in the threshold voltage of the transistor 313 between before and after performance of a bias-thermal stress (BT) test or light irradiation test on the transistor 313 can be reduced. Accordingly, the transistor 313 with stable electric characteristics can be manufactured.

Embodiment 4

In this embodiment, an example of manufacturing a display device in which at least part of a driver circuit and a transistor to be disposed in a pixel portion are formed over the same substrate will be described below.

The transistor to be disposed in the pixel portion is formed according to any one of Embodiments 1 to 3. Further, the transistor described in any of Embodiments 1 to 3 is an n-channel transistor, and thus part of a driver circuit that can be formed with n-channel transistors among driver circuits is formed over the same substrate as the transistor of the pixel portion.

Figure 5A:
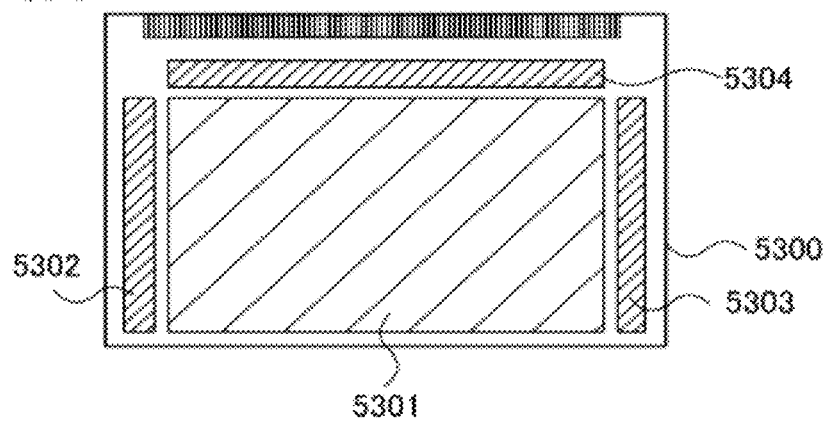
FIGS. 5A to 5C are a block diagram and equivalent circuit diagrams of one embodiment of the present invention.

FIG. 5A is an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix in respective regions where the scan lines and the signal lines intersect with each other. Further, the substrate 5300 in the display device is connected to a timing control circuit (also referred to as a controller or a controller IC) through a connection portion such as a flexible printed circuit (FPC).

In FIG. 5A, the first scan line driver circuit 5302, the second scan line driver circuit 5303, and the signal line driver circuit 5304 are formed over the same substrate 5300 as the pixel portion 5301. Accordingly, the number of components such as a driver circuit which are provided outside are reduced, so that reduction in cost can be achieved. Further, if the driver circuit is provided outside the substrate 5300, wirings would need to be extended and the number of connections of wirings would be increased, but by providing the driver circuit over the substrate 5300, the number of connections of the wirings can be reduced. Accordingly, improvement in reliability and yield can be achieved.

Figure 5B:
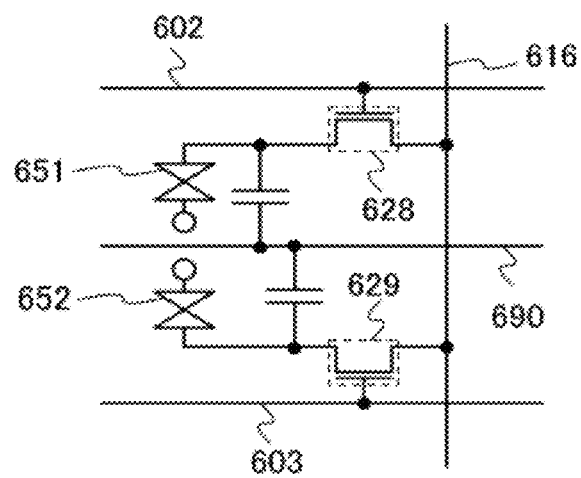

FIG. 5B shows an example of a circuit configuration of the pixel portion. Here, a pixel configuration of a VA liquid crystal display panel is described.

In this pixel configuration, a plurality of pixel electrode layers is provided in one pixel, and the pixel electrode layers are connected to respective transistors. The transistors are constructed so as to be driven by different gate signals. In other words, signals applied to individual pixel electrode layers in a multi-domain pixel are controlled independently.

A gate wiring 602 of a transistor 628 and a gate wiring 603 of a transistor 629 are separated so that different gate signals can be given thereto. In contrast, a source or drain electrode layer 616 functioning as a data line is shared by the transistor 628 and the transistor 629. As each of the transistor 628 and the transistor 629, any of the transistors described in Embodiments 1 to 3 can be used as appropriate.

A first pixel electrode layer and a second pixel electrode layer have different shapes and are separated by a slit. The second pixel electrode layer is provided so as to surround the external side of the first pixel electrode layer which is spread in a V shape. Timing of voltage application is made to vary between the first pixel electrode layer and the second pixel electrode layer by the transistor 628 and the transistor 629 in order to control alignment of the liquid crystal. The transistor 628 is connected to the gate wiring 602, and the transistor 629 is connected to the gate wiring 603. When different gate signals are supplied to the gate wiring 602 and the gate wiring 603, operation timings of the transistor 628 and the transistor 629 can be varied.

Further, a storage capacitor is formed using a capacitor wiring 690, a gate insulating layer as a dielectric, and a capacitor electrode electrically connected to the first pixel electrode layer or the second pixel electrode layer.

The first pixel electrode layer, a liquid crystal layer, and a counter electrode layer overlap each other to form a first liquid crystal element 651. The second pixel electrode layer, a liquid crystal layer, and a counter electrode layer overlap each other to form a second liquid crystal element 652. The pixel structure is a multi-domain structure in which the first liquid crystal element 651 and the second liquid crystal element 652 are provided in one pixel.

Note that the pixel configuration is not limited to the structure shown in FIG. 5B. For example, a switch, a resistor, a capacitor, a transistor, a sensor, a logic circuit, or the like may be added to the pixel illustrated in FIG. 5B.

In this embodiment, an example of the VA liquid crystal display panel is shown; however, it is not particularly limited, and the present invention can be applied to various modes of liquid crystal display devices. For example, as a method for improving viewing angle characteristics, the present invention can be applied to a lateral electric field method (also referred to as IPS) in which an electric field in the horizontal direction to the main surface of the substrate is applied to the liquid crystal layer.

For example, it is preferable to use a liquid crystal phase exhibiting a blue phase for which an alignment film is not necessary for an IPS liquid crystal display panel. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral agent at 5 wt % or more is mixed is used for the liquid crystal layer of the liquid crystal element in order to widen the temperature range. The liquid crystal composition which includes a liquid crystal phase exhibiting a blue phase and a chiral agent has a short response time of shorter than or equal to 1 msec, and has optical isotropy, which makes the alignment process unneeded and viewing angle dependence small.

Further, as a technique for improving moving image characteristics of a liquid crystal display device, there is another driving technique (e.g., a field sequential method) in which, as a backlight, a surface light source including a plurality of LED (light-emitting diode) light sources or a plurality of EL light sources is used, and each light source included in the surface light source is independently driven so as to perform intermittent lighting in one frame period. As the surface light source, three or more kinds of LEDs may be used or an LED emitting white light may be used. In the case where three or more kinds of light sources emitting different colors (e.g., light sources of red (R), green (G), and blue (B)) are used as the surface light source, color display can be performed without a color filter. Further, in the case where an LED emitting white light is used as the surface light source, color display is performed with a color filter. Since a plurality of LEDs can be controlled independently, the light emission timing of LEDs can be synchronized with the timing at which a liquid crystal layer is optically modulated. Part of the LEDs can be turned off; therefore, an advantageous effect of reducing power consumption can be obtained particularly in the case where an image having a large black part is displayed.

Figure 5C:
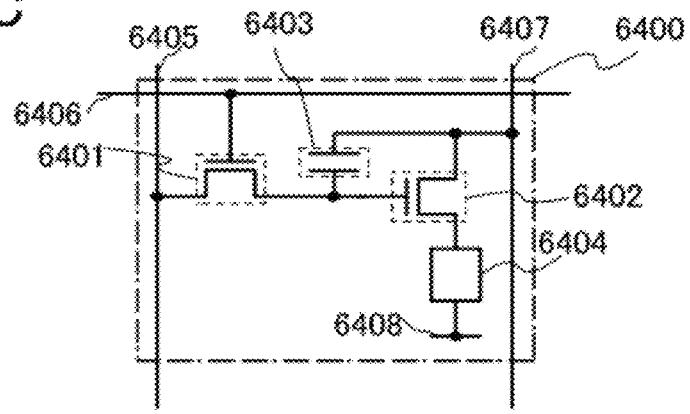

FIG. 5C shows another example of a circuit configuration of the pixel portion. Here, a pixel structure of a display panel using an organic EL element is described.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 5C shows an example of a pixel configuration to which digital time grayscale driving can be applied as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate electrode layer of the switching transistor 6401 is connected to a scan line 6406, a first electrode (one of a source electrode layer and a drain electrode layer) of the switching transistor 6401 is connected to a signal line 6405, and a second electrode (the other of the source electrode layer and the drain electrode layer) of the switching transistor 6401 is connected to a gate electrode layer of the driver transistor 6402. The gate electrode layer of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential that is lower than a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is higher than or equal to a forward threshold voltage of the light-emitting element 6404.

Note that gate capacitance of the driver transistor 6402 may be used as a substitute for the capacitor 6403, so that the capacitor 6403 can be omitted. The gate capacitance of the driver transistor 6402 may be formed between the channel formation region and the gate electrode layer.

In the case of a voltage-input voltage driving method, a video signal is input to the gate electrode layer of the driver transistor 6402 so that the driver transistor 6402 is in either of two states of being sufficiently turned on and turned off. That is, the driver transistor 6402 operates in a linear region. Thus, voltage higher than the voltage of the power supply line 6407 is applied to the gate electrode layer of the driver transistor 6402. Note that a voltage higher than or equal to the sum of the voltage of the power supply line and Vth of the driver transistor 6402 is applied to the signal line 6405.

In the case where analog grayscale driving is performed instead of digital time grayscale driving, the same pixel configuration as FIG. 5C can be employed by inputting signals in a different way.

In the case where analog grayscale driving is performed, a voltage greater than or equal to the sum of the forward voltage of the light-emitting element 6404 and Vth of the driving transistor 6402 is applied to the gate electrode layer of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel configuration is not limited to the structure shown in FIG. 5C. For example, a switch, a resistor, a capacitor, a transistor, a sensor, a logic circuit, or the like may be added to the pixel illustrated in FIG. 5C.

Next, the structure of a light-emitting element will be described with reference to FIGS. 6A to 6C. A cross-sectional structure of a pixel will be described by taking an n-channel transistor for driving a light-emitting element as an example. A transistor 7001 for driving a light-emitting element, a transistor 7011 for driving a light-emitting element, and a transistor 7021 for driving a light-emitting element which are used for semiconductor devices illustrated in FIGS. 6A, 6B, and 6C, respectively, can be manufactured in a manner similar to that of the transistor described in any of Embodiments 1 to 3, and in each of these transistors, nitrogen is contained at a high concentration at an interface between a gate insulating layer and an oxide semiconductor layer.

At least one of the first electrode and the second electrode of the light-emitting element is formed using a conductive film which transmits visible light, and light emission is extracted from the light-emitting element. Examples of the structures of the light-emitting element focusing on directions from which light is extracted are a top emission structure in which light emission is extracted from the side of the substrate on which the light-emitting element is formed without passing through the substrate over which the light-emitting element and the transistor are formed; a bottom emission structure in which light emission is extracted from the side where the light-emitting element is not formed through the substrate over which the light-emitting element is formed; and a dual emission structure in which light emission is extracted to both the side of the substrate on which the light-emitting element is formed and the other side of the substrate on which the light-emitting element is not formed. The pixel configuration illustrated in FIG. 5C can be applied to a light-emitting element having any of these emission structures.

A light-emitting element having a bottom emission structure is described with reference to FIG. 6A. The light-emitting element having a bottom emission structure emits light in a direction indicated by arrows in FIG. 6A.

In FIG. 6A, an example in which the transistor 211 described in Embodiment 2 is used as the transistor 7011 for driving a light-emitting element is shown; however, there is no particular limitation.

In FIG. 6A, over a first electrode 7017 having a light-transmitting property which is electrically connected to a source electrode or a drain electrode of the driver transistor 7011 for driving a light-emitting element, an EL layer 7014, a second electrode 7015, and a light shielding film 7016 are stacked in this order.

The first electrode 7017 is formed using a conductive film which transmits visible light. For the conductive film which transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. Further, a metal thin film with a thickness enough to transmit light (preferably, approximately 5 nm to 30 nm) can also be used. For example, an aluminum film with a thickness of 20 nm can be stacked over another conductive film having a light-transmitting property.

As for the second electrode 7015, a material which efficiently reflects light emitted from the EL layer 7014 is preferably used, in which case the light extraction efficiency can be improved. Note that the second electrode 7015 may have a stacked-layer structure. For example, it is also possible to stack a conductive film which transmits visible light on the side which is in contact with the EL layer 7014 and stack the light shielding film 7016 as film which shields light on the other side of the conductive film which transmits visible light. As the light shielding film, although a metal film or the like which efficiently reflects light emitted from the EL layer is preferable, for example, a resin or the like to which a black pigment is added can also be used.

Note that one of the first electrode 7017 and the second electrode 7015 functions as an anode, and the other functions as a cathode. It is preferable to use a substance having a high work function for the electrode which functions as an anode, and a substance having a low work function for the electrode which functions as a cathode.

As a material having a high work function, for example, ZrN, Ti, W, Ni, Pt, Cr, ITO, or IZO (registered trademark) can be used. As a material having a low work function, for example, an alkali metal such as Li or Cs, an alkaline earth metal such as Mg, Ca, or Sr, an alloy including any of these (such as Mg:Ag or Al:Li), a rare earth metal such as Yb or Er, or the like can be used.

Note that when power consumption is compared, it is preferable that the first electrode 7017 serve as a cathode and the second electrode 7015 serve as an anode because an increase in voltage of a driver circuit portion can be suppressed and power consumption can be reduced.

The EL layer 7014 includes at least the light-emitting layer and may be either a single layer or a stack of plural layers. As the structure in which a plurality of layers is stacked, a structure in which an anode, a hole injection layer, a hole transport layer, a light-emitting layer, an electron transport layer, an electron injection layer, and a cathode are stacked in this order can be given as an example. Note that unlike the light-emitting layer, not all of these layers except the light-emitting layer are necessarily provided in the EL layer 7014. Further, each of these layers may be provided in duplicate or more. Specifically, in the EL layer 7014, a plurality of light-emitting layers may be overlapped each other or another hole injection layer may overlap the electron injection layer. Furthermore, another component such as an electron-relay layer may be added as appropriate as an intermediate layer, in addition to the charge generation layer.

A light-emitting element 7012 is provided with a partition wall 7019 to cover edges of the first electrode 7017. As the partition wall 7019, an inorganic insulating film or an organic polysiloxane film can be applied in addition to an organic resin film of polyimide, acrylic, polyamide, epoxy, or the like. It is particularly preferable that the partition wall 7019 be formed using a photosensitive resin material so that a side surface of the partition wall 7019 be formed as a tilted surface with a continuous curvature. In the case where a photosensitive resin material is used for the partition wall 7019, a step of forming a resist mask can be omitted. Further, the partition wall can be formed using an inorganic insulating film. When the inorganic insulating film is used for the partition wall, the amount of moisture contained in the partition wall can be reduced.

Note that a color filter layer 7033 is provided between the light-emitting element 7012 and a substrate 7010 (see FIG. 6A). A structure for emitting white light is employed for the light-emitting element 7012, whereby light emitted from the light-emitting element 7012 passes through the color filter layer 7033 and then passes through a second gate insulating layer 7031, a first gate insulating layer 7030, and the substrate 7010 so as to be emitted to the outside.

Plural kinds of the color filter layer 7033 may be formed. For example, a red color filter layer, a blue color filter layer, a green color filter layer, or the like can be provided in each pixel. Note that the color filter layer 7033 is formed by a droplet discharge method such as an ink jet method, a printing method, an etching method using a photolithography technique, or the like.

The color filter layer 7033 is covered with an overcoat layer 7034 and a protective insulating layer 7035 is further formed thereover. Note that although the overcoat layer 7034 with a small thickness is illustrated in FIG. 6A, the overcoat layer 7034 is formed using a resin material such as an acrylic resin and has a function of planarizing roughness due to the color filter layer 7033.

A contact hole which is formed in the second gate insulating layer 7031, an insulating layer 7032, the color filter layer 7033, the overcoat layer 7034, and the protective insulating layer 7035 and which reaches the drain electrode layer is provided in a position overlapping the partition wall 7019.

Next, a light-emitting element having a dual emission structure is described with reference to FIG. 6B. The light-emitting element having a dual emission structure emits light in a direction indicated by arrows in FIG. 6B.

In FIG. 6B, an example in which the transistor 211 described in Embodiment 2 is used as the transistor 7021 for driving a light-emitting element is shown; however, there is no particular limitation.

In FIG. 6B, over a first electrode 7027 having a light-transmitting property which is electrically connected to a source electrode or a drain electrode of the driver transistor 7021 for driving a light-emitting element, an EL layer 7024 and a second electrode 7025 are stacked in this order.

The first electrode 7027 and the second electrode 7025 are each formed using a conductive film which transmits visible light. The material which can be used for the first electrode 7017 of FIG. 6A can be used for the conductive film which transmits visible light. Thus, the description of the first electrode 7017 is referred to for the details.

Note that one of the first electrode 7027 and the second electrode 7025 functions as an anode, and the other functions as a cathode. It is preferable to use a substance having a high work function for the electrode which functions as an anode, and a substance having a low work function for the electrode which functions as a cathode.

The EL layer 7024 may be either a single layer or a stack of plural layers. As for the EL layer 7024, the structure and material which can be used in FIG. 6A for the EL layer 7014 can be used. Thus, the description of the EL layer 7014 is referred to for the details.

A light-emitting element 7022 is provided with a partition wall 7029 to cover edges of the first electrode 7027. As for the partition wall 7029, the structure and material which can be used in FIG. 6A for the partition wall 7019 can be used. Thus, the description of the partition wall 7019 is referred to for the details.

In addition, in the element structure illustrated in FIG. 6B, light is emitted from the light-emitting element 7022 to both the second electrode 7025 side and the first electrode 7027 side as indicated by arrows, and light emitted to the first electrode 7027 side passes through a second gate insulating layer 7041, an insulating layer 7042, a first gate insulating layer 7040, and a substrate 7020 so as to be emitted to the outside.

In the structure of FIG. 6B, when full color display is performed, for example, the light-emitting element 7022 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements which include a white light-emitting element in addition to three kinds of light-emitting elements.

Next, a light-emitting element having a top emission structure is described with reference to FIG. 6C. The light-emitting element having a top emission structure emits light in a direction indicated by arrows in FIG. 6C.

In FIG. 6C, an example in which the transistor 211 described in Embodiment 2 is used as the transistor 7001 for driving a light-emitting element is shown; however, there is no particular limitation.

In FIG. 6C, over a first electrode 7003 which is electrically connected to a source electrode or a drain electrode of the driver transistor 7001 for driving a light-emitting element, an EL layer 7004 and a second electrode 7005 are stacked in this order.

As for the first electrode 7003, a material which efficiently reflects light emitted from the EL layer 7004 is preferably used, in which case the light extraction efficiency can be improved. Note that the first electrode 7003 may have a stacked-layer structure. For example, it is also possible to stack a conductive film which transmits visible light on the side which is in contact with the EL layer 7004 and stack a light shielding film on the other side of the conductive film which transmits visible light. As the light shielding film, although a metal film or the like which efficiently reflects light emitted from the EL layer is preferable, for example, a resin or the like to which a black pigment is added can also be used.

The second electrode 7005 is formed using a conductive film which transmits visible light. The material which can be used for the first electrode 7017 of FIG. 6A can be used for the conductive film which transmits visible light. Thus, the description of the first electrode 7017 is referred to for the details.

Note that one of the first electrode 7003 and the second electrode 7005 functions as an anode, and the other functions as a cathode. It is preferable to use a substance having a high work function for the electrode which functions as an anode, and a substance having a low work function for the electrode which functions as a cathode.

The EL layer 7004 may be either a single layer or a stack of plural layers. As for the EL layer 7004, the structure and material which can be used in FIG. 6A for the EL layer 7014 can be used. Thus, the description of the EL layer 7014 is referred to for the details.

A light-emitting element 7002 is provided with a partition wall 7009 to cover edges of the first electrode 7003. As for the partition wall 7009, the structure and material which can be used in FIG. 6A for the partition wall 7019 can be used. Thus, the description of the partition wall 7019 is referred to for the details.

In FIG. 6C, the source electrode or the drain electrode of the transistor 7001 for driving a light-emitting element is electrically connected to the first electrode 7003 through a contact hole provided in a protective insulating layer 7052 and an insulating layer 7055. A planarizing insulating layer 7053 can be formed using a resin material such as polyimide, acrylic, benzocyclobutene resin, polyamide, or epoxy. Other than such organic materials, it is also possible to use a low-dielectric constant material (a low-k material), a siloxane-based resin, or the like. Note that the planarizing insulating layer 7053 may be formed by stacking a plurality of insulating films formed using any of these materials. There is no particular limitation on the formation method of the planarizing insulating layer 7053, and the following method can be employed depending on the material: a sputtering method, an SOG method, spin coating, dip coating, spray coating, a droplet discharging method (e.g., an ink jet method, screen printing, or offset printing), or the like.

In the structure of FIG. 6C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements which include a white light-emitting element in addition to three kinds of light-emitting elements.

In the structure of FIG. 6C, a light-emitting display device capable of full color display may be manufactured in such a manner that all of a plurality of light-emitting elements which is arranged is white light-emitting elements and a sealing substrate having a color filter or the like is provided over the light-emitting element 7002. When a material which exhibits monochromatic light such as white light is formed and combined with color filters or color conversion layers, full-color display can be performed.

Needless to say, display of monochromatic light can also be performed. For example, a lighting device may be formed utilizing white light emission; alternatively, an area-color light-emitting device using monochromatic light emission may be formed.

If necessary, an optical film such as a polarizing film including a circularly polarizing plate may be provided.

Note that the example is described in which a transistor which controls the driving of a light-emitting element (a transistor for driving a light-emitting element) is electrically connected to the light-emitting element; however, a structure may be employed in which a transistor for current control is connected between the transistor for driving a light-emitting element and the light-emitting element.

Note that the structure of the semiconductor device described in this embodiment is not limited to those illustrated in FIGS. 6A to 6C and can be modified in various ways based on the spirit of techniques of the present invention.

Embodiment 5

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the display device described in any of the above embodiments will be described.

FIG. 7A illustrates a portable information terminal, which includes a main body 3001, a housing 3002, a display portion 3003a, a display portion 3003b, and the like. The display portion 3003b functions as a panel having a touch input function. By touching keyboard buttons 3004 displayed on the display portion 3003b, a screen can operate, and text can be input. Needless to say, the display portion 3003a may function as a panel having a touch input function. A liquid crystal panel or an organic light-emitting panel described in Embodiment 4 is manufactured by using the transistor 111 described in Embodiment 1 as a switching element and applied to the display portion 3003a or 3003b, whereby a portable information terminal can be provided.

The portable information terminal illustrated in FIG. 7A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (e.g., an earphone terminal or a USB terminal), a recording medium insertion portion, and the like may be provided on the back surface or the side surface of the housing.

The portable information terminal illustrated in FIG. 7A may transmit and receive data wirelessly. Through wireless communication, desired book data or the like can be purchased and downloaded from an electronic book server.

Further, in the portable information terminal illustrated in FIG. 7A, one of the two display portions, the display portion 3003a and the display portion 3003b, can be detached, the case of which is illustrated in FIG. 7B. When the display portion 3003a also functions as a panel having a touch input function, further reduction in weight can be achieved when the portable information terminal illustrated in FIG. 7A is carried. Accordingly, the housing 3002 can be held by one hand and can operate by the other hand, which is convenient.

Furthermore, when the housing 3002 illustrated in FIG. 7B functions as an antenna, a microphone, or a wireless communication device, the housing 3002 may be used as a mobile phone handset.

FIG. 7C shows an example of a mobile phone handset. A mobile phone handset 5005 illustrated in FIG. 7C is provided with a display portion 5001 incorporated in a housing, a display panel 5003 attached to a hinge 5002, operation buttons 5004, a speaker, a microphone, and the like.

In the mobile phone handset 5005 illustrated in FIG. 7C, the display panel 5003 is slid to overlap the display portion 5001, and the display panel 5003 also functions as a cover having a light-transmitting property. The display panel 5003 is a display panel including the light-emitting element having a dual emission structure illustrated in FIG. 6B in Embodiment 4, in which light emission is extracted through the surface opposite to the substrate side and the surface on the substrate side.

Since the light-emitting element having a dual emission structure is used for the display panel 5003, display can be performed also with the display portion 5001 overlapped; therefore, both the display portion 5001 and the display panel 5003 can perform display and the users can view both the displays. The display panel 5003 has a light-transmitting property and the view beyond the display panel can be seen. For example, when a map is displayed on the display portion 5001 and the location points of users are displayed using the display panel 5003, the present location can be recognized easily.

Further, in the case where the mobile phone handset 5005 is provided with an image sensor to be used as a television telephone, it is possible to make conversation with plural persons while their faces are displayed; therefore, a television conference or the like can be performed. For example, when the face of a single person or the faces of plural persons are displayed on the display panel 5003 and further the face of another person is displayed on the display portion 5001, users can make conversation while viewing the faces of two or more persons.

When a touch input button 5006 displayed on the display panel 5003 is touched with a finger or the like, data can be inputted into the mobile phone handset 5005. Further, the user can make a call or compose an e-mail by sliding the display panel 5003 and touching the operation buttons 5004 with a finger or the like.

FIG. 7D shows an example of a television set. In a television set 9600, a display portion 9603 is incorporated in a housing 9601. The display portion 9603 can display images. Here, the housing 9601 is supported on a stand 9605 provided with a CPU. When the transistor 211 described in Embodiment 2 is applied to the display portion 9603, the television set 9600 can be obtained.

The television set 9600 can operate by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Further, when the television device is connected to a communication network with or without wires via the modem, one-way (from a sender to a receiver) or two-way (between a sender and a receiver or between receivers) information communication can be performed.

Further, the television set 9600 is provided with an external connection terminal 9604, a storage medium recording and reproducing portion 9602, and an external memory slot. The external connection terminal 9604 can be connected to various types of cables such as a USB cable, and data communication with a personal computer or the like is possible. A disk storage medium is inserted into the storage medium recording and reproducing portion 9602 and it is possible to read data stored in the storage medium and write data to the storage medium. In addition, a picture, a video, or the like stored as data in an external memory 9606 inserted to the external memory slot can be displayed on the display portion 9603.

The structures, methods, and the like described in this embodiment can be combined as appropriate with any of the structures, methods, and the like described in the other embodiments.

Embodiment 6

In this embodiment, a semiconductor film will be described with reference to FIG. 10, FIGS. 11A and 11B, FIGS. 12A to 12C, FIGS. 13A and 13B, and FIGS. 14A and 14B which includes a stack of an oxide semiconductor film having a high nitrogen concentration, whose one surface is in contact with an insulating surface, and an oxide semiconductor film in contact with the other surface of the oxide semiconductor film having a high nitrogen concentration; and the oxide semiconductor film having a high nitrogen concentration includes a c-axis aligned wurtzite crystal (a first crystal type) and the oxide semiconductor film includes a c-axis aligned hexagonal anisotropic crystal (a second crystal type) different from the first crystal type.

Figure 10:
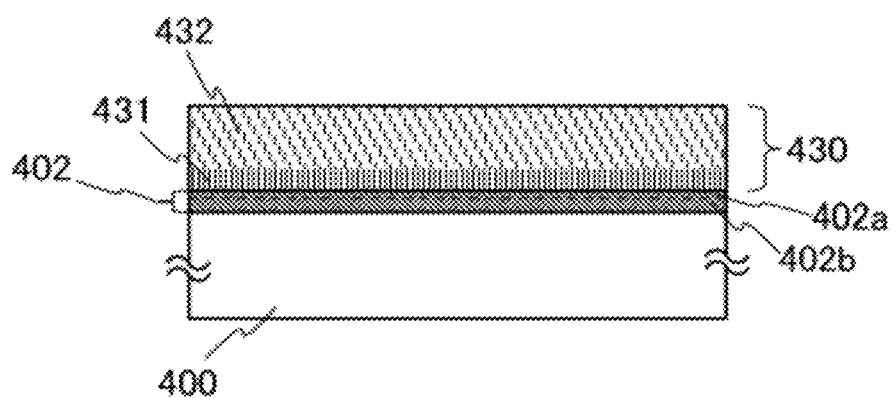
FIG. 10 illustrates a wurtzite crystal structure.

A schematic cross-sectional view of a semiconductor film including a stack of different crystal structures, an example of which is shown in this embodiment, is illustrated in FIG. 10.

A semiconductor film 430 includes an oxide semiconductor film 431 having a high nitrogen concentration and an oxide semiconductor film 432. A mode of the semiconductor film 430 in which the oxide semiconductor film 431 having a high nitrogen concentration is provided in contact with an insulating surface 402 over a substrate 400 is illustrated in FIG. 10. Note that the insulating surface 402 includes an insulating surface 402a to which nitrogen is added and an insulating surface 402b to which nitrogen is not added. The oxide semiconductor film 431 having a high nitrogen concentration includes a c-axis aligned wurtzite crystal as the first crystal, and the oxide semiconductor film 432 includes a c-axis aligned hexagonal anisotropic crystal as the second crystal. Accordingly, the oxide semiconductor film 431 having a high nitrogen concentration has higher crystallinity than the oxide semiconductor film 432.

<Hexagonal Crystal Structure>

Hexagonal crystal structures as the first crystal type and the second crystal type will be described first.

Figure 11A:
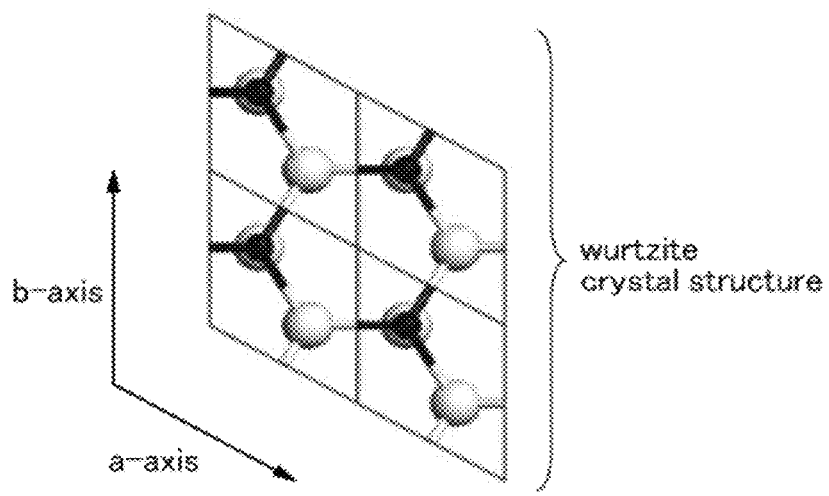
FIGS. 11A and 11B illustrate a wurtzite crystal structure.
Figure 11B:
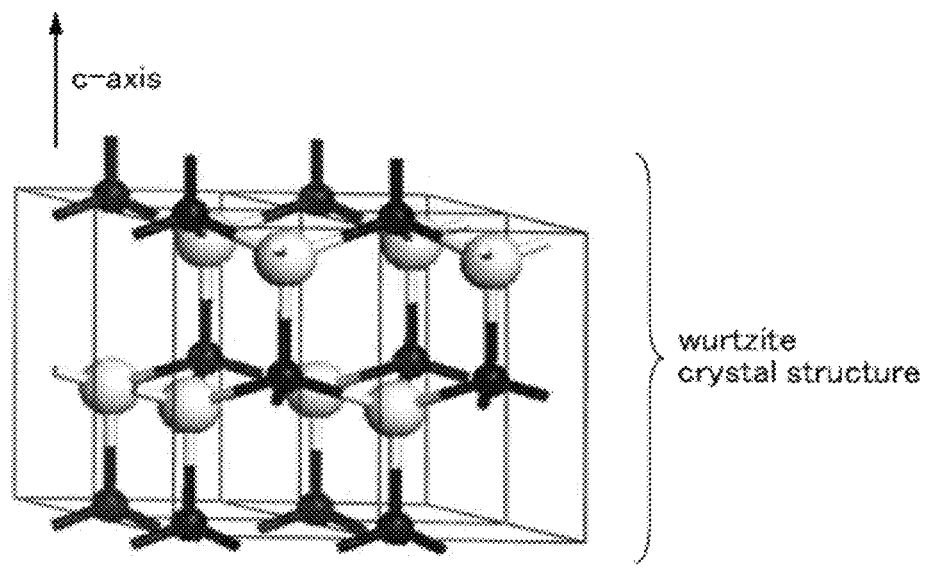

First, the wurtzite crystal structure as the first crystal type will be described with reference to FIGS. 11A and 11B. As for the wurtzite crystal structure, FIG. 11A illustrates distribution of atoms in the a-b plane, and FIG. 11B illustrates a structure where the c-axis direction is the vertical direction.

Indium nitride and gallium nitride can be given as examples of a material whose crystal has the wurtzite crystal structure. Further, an oxide semiconductor containing nitrogen can be a film including the c-axis aligned wurtzite crystal in some cases.

Specifically, an In—Ga—Zn—O film containing nitrogen at a concentration higher than or equal to $5\times10^{19}/cm^3$, preferably higher than or equal to $1\times10^{20}/cm^3$ and lower than 7 atomic %, becomes a film including the c-axis aligned wurtzite crystal; and In, Ga, and Zn are included at random in a metal site.

Next, the hexagonal crystal structure as the second crystal type will be described.

For example, an In—Ga—Zn—O film containing nitrogen at a concentration higher than or equal to $1\times10^{17}/cm^3$ and lower than $5\times10^{19}/cm^3$ becomes a film including the c-axis aligned hexagonal crystal as the second crystal type. The In—Ga—Zn—O film including the c-axis aligned hexagonal crystal as the second crystal type has an In—O crystal plane (a crystal plane containing indium and oxygen) in the a-b plane and two layers containing Ga and Zn between In—O crystal planes. Note that as for the two layers containing Ga and Zn, there is no limitation on the position of Ga and Zn as long as at least one of Ga and Zn is contained in each of the layers.

The wurtzite crystal structure as the first crystal type and the hexagonal crystal structure as the second crystal type are both hexagonal crystal structures, in which atoms are arranged in a hexagonal shape in the a-b plane. Further, the hexagonal crystal as the second crystal type is in contact with the wurtzite crystal, and the hexagonal crystal as the second crystal type is matched with the wurtzite crystal.

Figure 12A:
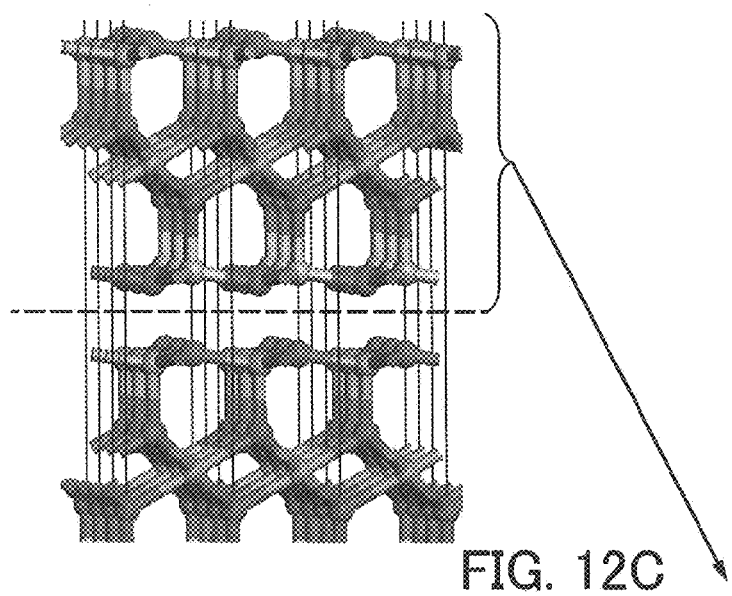
FIGS. 12A to 12C illustrate a wurtzite crystal structure and a non-wurtzite crystal structure.
Figure 12C:
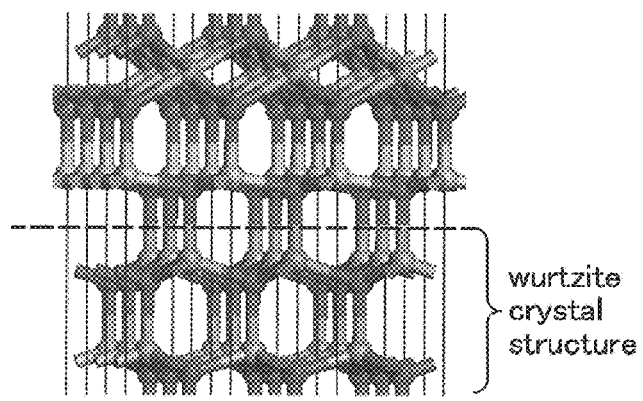
Figure 12B:
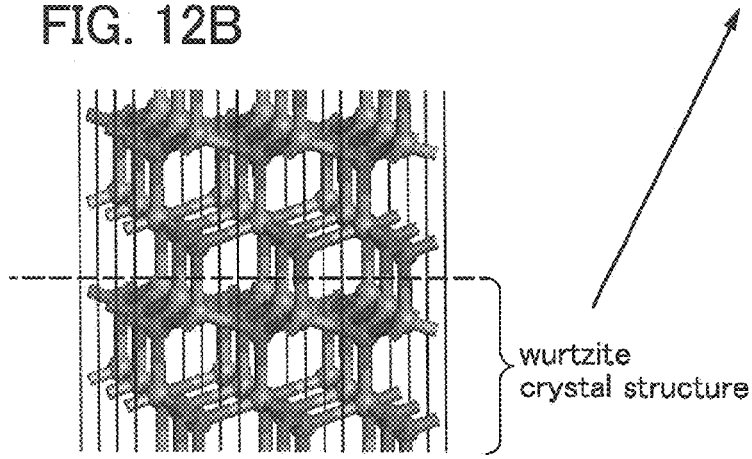

FIGS. 12A to 12C illustrate a manner in which the hexagonal second crystal having the same lattice constant is aligned on the wurtzite crystal. FIG. 12A illustrates the hexagonal second crystal structure, and FIG. 12B illustrates the wurtzite crystal structure. In addition, FIG. 12C is a schematic view illustrating a manner in which the hexagonal second crystal is in contact with the wurtzite crystal and the hexagonal second crystal is matched with the wurtzite crystal.

Thus, the oxide semiconductor film having a high nitrogen concentration including the wurtzite crystal which has high crystallinity and is easily crystallized is formed, and the oxide semiconductor film is formed in contact with the oxide semiconductor film having a high nitrogen concentration, whereby an advantageous effect that the wurtzite crystal included in the oxide semiconductor film having a high nitrogen concentration facilitates crystallization of the oxide semiconductor film is obtained.

<Oxide Semiconductor Film Having High Nitrogen Concentration>

Next, the oxide semiconductor film having a high nitrogen concentration will be described. The oxide semiconductor film having a high nitrogen concentration includes the c-axis aligned wurtzite crystal. In particular, the oxide semiconductor film having a high nitrogen concentration is formed using a material that has high crystallinity and is easily crystallized as compared to the oxide semiconductor film.

The wurtzite crystal as the first crystal type which can be applied to the oxide semiconductor film having a high nitrogen concentration will be described below.

The nitrogen concentration of the oxide semiconductor film having a high nitrogen concentration, which has a wurtzite crystal structure, is higher than or equal to $5\times10^{19}/cm^3$, preferably higher than or equal to $1\times10^{20}/cm^3$ and lower than 7 atomic %. In an oxide semiconductor film having a high nitrogen concentration in which nitrogen is intentionally contained so that a nitrogen concentration higher than or equal to $5\times10^{19}/cm^3$, preferably higher than or equal to $1\times10^{20}/cm^3$ and lower than 7 atomic %, can be obtained, the energy gap is smaller than the energy gap of an oxide semiconductor film in which nitrogen is not contained intentionally; thus, carriers easily flow therethrough.

Note that a diffraction image where bright points appear alternately may be observed in an observation image of the wurtzite crystal structure, which is obtained using a high-angle annular dark field (HAADF)-STEM.

Figure 13A:
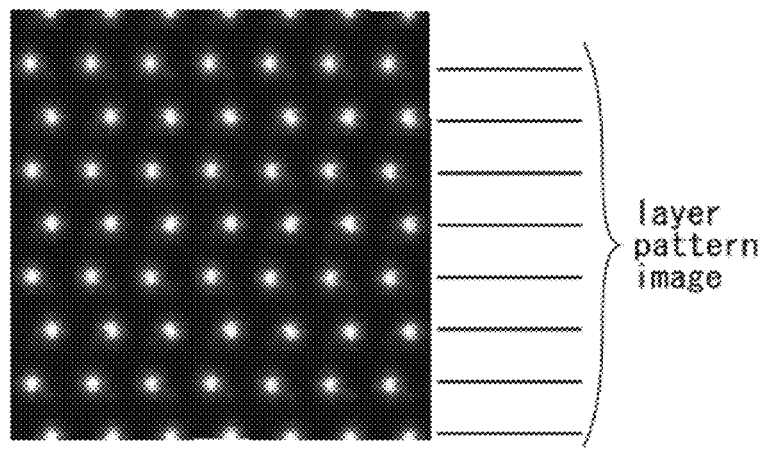
FIGS. 13A and 13B are real observation images of HAADF-STEM of a crystal structure according to Embodiment.

FIG. 13A shows a HAADF-STEM observation image obtained by calculation based on the wurtzite crystal structure.

Figure 13B:
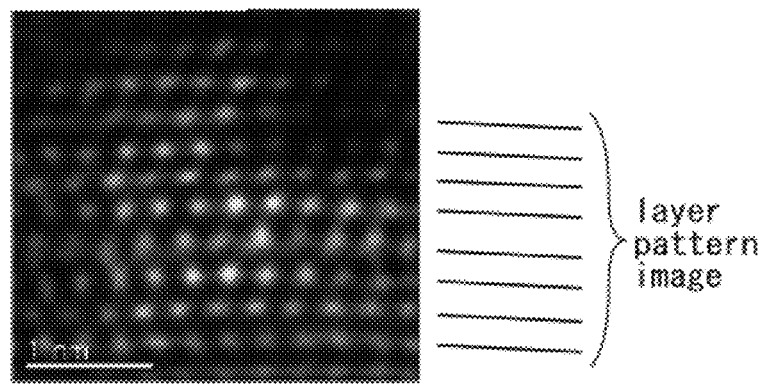

FIG. 13B shows a HAADF-STEM observation image of an In—Ga—Zn—O film formed using a deposition gas containing only nitrogen.

From each of the HAADF-STEM observation images in FIGS. 13A and 13B, it can be confirmed that the wurtzite crystal structure has a two-cycle layer structure.

Note that the In—Ga—Zn—O film containing nitrogen was formed by a sputtering method over a quartz glass substrate to a thickness of 300 nm. Deposition was performed under conditions where a target containing In, Ga, and Zn at 1:1:1 [atomic ratio] was used, the distance between the substrate and the target was 60 mm, a DC power source was used, the power was 0.5 kw, and the pressure was 0.4 Pa. In addition, the substrate temperature during deposition was 400° C., and only nitrogen was introduced as a sputtering gas into a deposition chamber at a flow rate of 40 sccm.

Next, the hexagonal crystal as the second crystal type will be described.

As examples of the hexagonal (non-wurtzite) crystal structure as the second crystal type, a $YbFe_2O_4$-type structure, a $Yb_2Fe_3O_7$-type structure, and deformed structures of the foregoing structures can be given. For example, In—Ga—Zn—O that is a three-component metal oxide has the hexagonal crystal structure as the second crystal type and can be used for the oxide semiconductor film. Note that the In—Ga—Zn—O film which can be used as the oxide semiconductor film may contain nitrogen at a concentration higher than or equal to $1\times10^{17}/cm^3$ and lower than or equal to $5\times10^{19}/cm^3$.

Examples of In—Ga—Zn—O that is a three-component metal oxide include $InGaZnO_4$ having a $YbFe_2O_4$-type structure and $In_2Ga_2ZnO_7$ having a $Yb_2Fe_3O_7$-type structure, and the In—Ga—Zn—O can have any of deformed structures of the foregoing structures, which is disclosed in the following document: M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315.

Further, as the oxide semiconductor film, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; a two-component metal oxide such as an In—Zn—O film, a Sn—Zn—O film, an Al—Zn—O film, or an In—Ga—O film; or the like can be used. Further, silicon may be contained in the above oxide semiconductor film. In this specification, for example, an In—Ga—Zn—O film means an oxide film containing indium (In), gallium (Ga), and zinc (Zn).

In addition, it is known that examples of the In—Ga—Zn—O that is a three-component metal oxide include $InGaZnO_4$ having a $YbFe_2O_4$-type structure and $In_2Ga_2ZnO_7$ having a $Yb_2Fe_3O_7$-type structure, and the In—Ga—Zn—O can have any of deformed structures of the foregoing structures (M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315). Note that a layer containing Yb is denoted by an A layer and a layer containing Fe is denoted by a B layer, below. The $YbFe_2O_4$-type structure has a repeated structure of ABB|ABB|ABB. As an example of a deformed structure of the $YbFe_2O_4$-type structure, a repeated structure of ABBB|ABBB can be given. Further, the $Yb_2Fe_3O_7$-type structure has a repeated structure of ABB|AB|ABB|AB. As an example of a deformed structure of the $Yb_2Fe_3O_7$-type structure, a repeated structure of ABBB|ABB|ABBB|ABB|ABBB|ABB| can be given.

The oxide semiconductor film is formed over and in contact with the oxide semiconductor film having a high nitrogen concentration. Accordingly, a highly crystalline region of the semiconductor film having a stacked-layer structure of different crystal structures is in contact with an insulating surface, whereby interface states due to dangling bonds can be reduced, so that a semiconductor film which has a stacked-layer structure of different crystal structures and a favorable interface condition can be provided.

Note that a diffraction image where one layer with bright patterns appears in every third layer may be observed in an observation image of the hexagonal crystal structure as the second crystal type, which is obtained using a high-angle annular dark field (HAADF)-STEM.

Figure 14A:
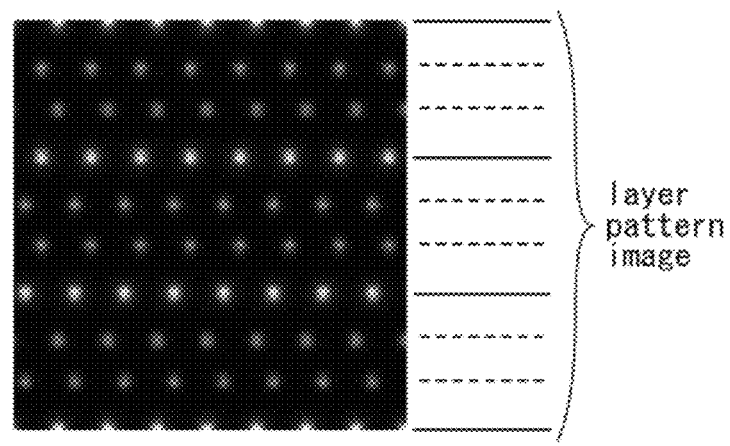
FIGS. 14A and 14B are real observation images of HAADF-STEM of a crystal structure according to Embodiment.

FIG. 14A shows a HAADF-STEM observation image obtained by calculation based on the hexagonal crystal structure as the second crystal type.

Figure 14B:
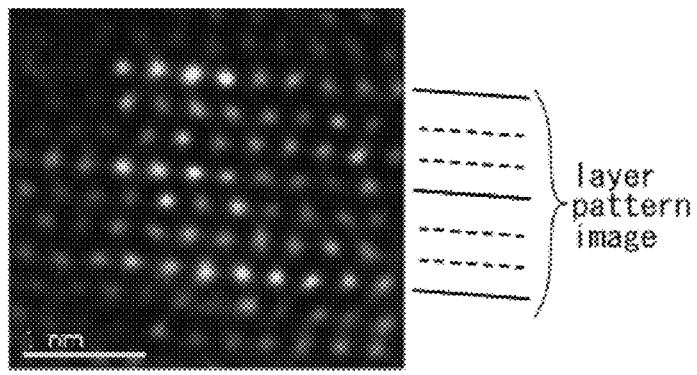

FIG. 14B shows a HAADF-STEM observation image of an In—Ga—Zn—O film.

From each of the HAADF-STEM observation images in FIGS. 14A and 14B, it can be confirmed that one layer with bright patterns appears in every third layer and that the hexagonal crystal structure as the second crystal type has a nine-cycle layer structure.

Note that the In—Ga—Zn—O film was formed by a sputtering method over a quartz glass substrate to a thickness of 300 nm. Deposition was performed under conditions where a target containing In, Ga, and Zn at 1:1:1 [atomic ratio] was used, the distance between the substrate and the target was 60 mm, a DC power source was used, the power was 0.5 kw, and the pressure was 0.4 Pa. In addition, the substrate temperature during deposition was 400° C., and only oxygen was introduced as a sputtering gas into a deposition chamber at a flow rate of 40 sccm.

The structures, methods, and the like described in this embodiment can be combined as appropriate with any of the structures, methods, and the like described in the other embodiments.

This application is based on Japanese Patent Application Serial No. 2010-267919 filed with Japan Patent Office on Nov. 30, 2010, the entire contents of which are hereby incorporated by reference.

What is claimed is:

1. A semiconductor device comprising:
a gate electrode layer;
a first insulating layer in contact with the gate electrode layer;
an oxide semiconductor layer in contact with the first insulating layer; and
a second insulating layer in contact with the oxide semiconductor layer,
wherein the oxide semiconductor layer has a peak of a nitrogen concentration at an interface with the first insulating layer, and
wherein the first insulating layer contains nitrogen and has a peak of a nitrogen concentration at an interface with the oxide semiconductor layer.

2. The semiconductor device according to claim 1, wherein the oxide semiconductor layer has a concentration gradient of nitrogen, which becomes higher the closer to the first insulating layer, and has a concentration gradient of oxygen, which becomes higher the closer to the second insulating layer.

3. The semiconductor device according to claim 1, wherein a region of the oxide semiconductor layer, which is in the vicinity of the interface with the first insulating layer, has higher crystallinity than other regions.

4. The semiconductor device according to claim 1, wherein a nitrogen concentration of the oxide semiconductor layer in the vicinity of the interface with the first insulating layer is higher than or equal to $5 \times 10^{19}/cm^3$.

5. The semiconductor device according to claim 1, wherein a nitrogen concentration of the oxide semiconductor layer in the vicinity of the interface with the second insulating layer is lower than or equal to $5 \times 10^{19}/cm^3$.

6. The semiconductor device according to claim 1,
wherein the oxide semiconductor layer has a peak of an oxygen concentration at an interface with the second insulating layer, and
wherein the second insulating layer contains oxygen and has a peak of an oxygen concentration at an interface with the oxide semiconductor layer.

7. The semiconductor device according to claim 1, wherein at least part of the oxide semiconductor layer has crystallinity and is c-axis aligned.

8. The semiconductor device according to claim 1, wherein the oxide semiconductor layer comprises indium and zinc.

9. The semiconductor device according to claim 1, wherein the oxide semiconductor layer comprises at least a hexagonal wurtzite crystal structure.

10. The semiconductor device according to claim 1, wherein the oxide semiconductor layer comprises indium, gallium and zinc.

11. The semiconductor device according to claim 1, wherein the oxide semiconductor layer includes a crystalline region.

12. A semiconductor device comprising:
a gate electrode layer;
a first insulating layer in contact with the gate electrode layer;

an oxide semiconductor layer in contact with the first insulating layer, the oxide semiconductor layer comprising indium and zinc; and a second insulating layer in contact with the oxide semiconductor layer, wherein the oxide semiconductor layer has a peak of a nitrogen concentration at an interface with the first insulating layer, and wherein the first insulating layer contains nitrogen and has a peak of a nitrogen concentration at an interface with the oxide semiconductor layer, and wherein the oxide semiconductor layer includes a crystalline region, the crystalline region having a c-axis being substantially perpendicular to a surface of the oxide semiconductor layer.

13. The semiconductor device according to claim 12, wherein the oxide semiconductor layer has a concentration gradient of nitrogen, which becomes higher the closer to the first insulating layer, and has a concentration gradient of oxygen, which becomes higher the closer to the second insulating layer.

14. The semiconductor device according to claim 12, wherein a region of the oxide semiconductor layer, which is in the vicinity of the interface with the first insulating layer, has higher crystallinity than other regions.

15. The semiconductor device according to claim 12, wherein a nitrogen concentration of the oxide semiconductor layer in the vicinity of the interface with the first insulating layer is higher than or equal to $5 \times 10^{19}/cm^3$.

16. The semiconductor device according to claim 12, wherein a nitrogen concentration of the oxide semiconductor layer in the vicinity of the interface with the second insulating layer is lower than or equal to $5 \times 10^{19}/cm^3$.

17. The semiconductor device according to claim 12, wherein the oxide semiconductor layer has a peak of an oxygen concentration at an interface with the second insulating layer, and wherein the second insulating layer contains oxygen and has a peak of an oxygen concentration at an interface with the oxide semiconductor layer.

18. The semiconductor device according to claim 12, wherein at least part of the oxide semiconductor layer has crystallinity and is c-axis aligned.

19. The semiconductor device according to claim 12, wherein the oxide semiconductor layer comprises at least a hexagonal wurtzite crystal structure.

20. The semiconductor device according to claim 12, wherein the oxide semiconductor layer further comprises gallium.

* * * * *